US012622018B2

(12) United States Patent
Jen et al.

(10) Patent No.: US 12,622,018 B2
(45) Date of Patent: May 5, 2026

(54) MULTI-LAYERED OR GRADED SEMICONDUCTOR REGION IN THIN FILM TRANSISTOR (TFT) STRUCTURES

(71) Applicant: Intel Corporation, Santa Clara, CA (US)

(72) Inventors: Timothy Jen, Portland, OR (US); Prem Chanani, Hillsboro, OR (US); Cheng Tan, Hillsboro, OR (US); Brian Wadsworth, Portland, OR (US); Andre Baran, Portland, OR (US); James Pellegren, Portland, OR (US); Christopher J. Wiegand, Portland, OR (US); Van H. Le, Beaverton, OR (US); Abhishek Anil Sharma, Portland, OR (US); Shailesh Kumar Madisetti, Hillsboro, OR (US); Xiaojun Weng, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 145 days.

(21) Appl. No.: 17/742,644

(22) Filed: May 12, 2022

(65) Prior Publication Data

US 2023/0369508 A1     Nov. 16, 2023

(51) Int. Cl.
*H01L 29/786*     (2006.01)
*H01L 23/528*     (2006.01)
(Continued)

(52) U.S. Cl.
CPC ..... *H10D 30/6748* (2025.01); *H01L 23/5283* (2013.01); *H10B 12/315* (2023.02); *H10D 30/6755* (2025.01)

(58) Field of Classification Search
CPC .............. H10D 30/6748; H10D 30/67; H10D 30/6755; H10D 30/6757; H10D 30/6708; H10D 30/6715; H10D 30/675; H10D 86/423; H10D 86/40; H10D 86/60; H10D 84/00; H10D 84/0126; H10D 84/01;
(Continued)

(56) References Cited

U.S. PATENT DOCUMENTS 11,705,521 B2 *  7/2023  Lee ..................... H10D 30/6757
                                                    257/401
2022/0115539 A1 *  4/2022  Lee ..................... H10D 30/014

* cited by examiner

*Primary Examiner* — Nikolay K Yushin
(74) *Attorney, Agent, or Firm* — Arcane Law PLLC

(57) ABSTRACT

Techniques for forming thin film transistors (TFTs) having multilayer and/or concentration gradient semiconductor regions. An example integrated circuit includes a gate electrode, a gate dielectric on the gate electrode, and a semiconductor region on the gate dielectric. In some cases, the semiconductor region includes a plurality of compositionally different material layers, at least two layers of the different material layers each being a semiconductor layer. In some other cases, the semiconductor region includes a single layer having a material concentration gradient extending from a bottom surface of the single layer (adjacent to the gate dielectric) to a top surface of the single layer. The integrated circuit further includes first and second conductive contacts that each contact a respective portion of the semiconductor region. One example application of the techniques is with respect to forming backend (within the interconnect region) memory structures configured with multilayer and/or concentration gradient TFTs.

20 Claims, 17 Drawing Sheets

(51) Int. Cl.
   *H01L 27/108* (2006.01)
   *H10B 12/00* (2023.01)
   *H10D 30/67* (2025.01)
(58) Field of Classification Search
   CPC .. H10D 84/038; H10D 84/03; H01L 23/5283;
   H01L 23/52; H01L 23/5226; H01L
   23/528; H10B 12/315; H10B 12/00;
   H10B 12/05; H10B 12/50; H10B 41/70;
   H10B 41/30; H10B 41/48; H10B 41/44
   See application file for complete search history.

212

210

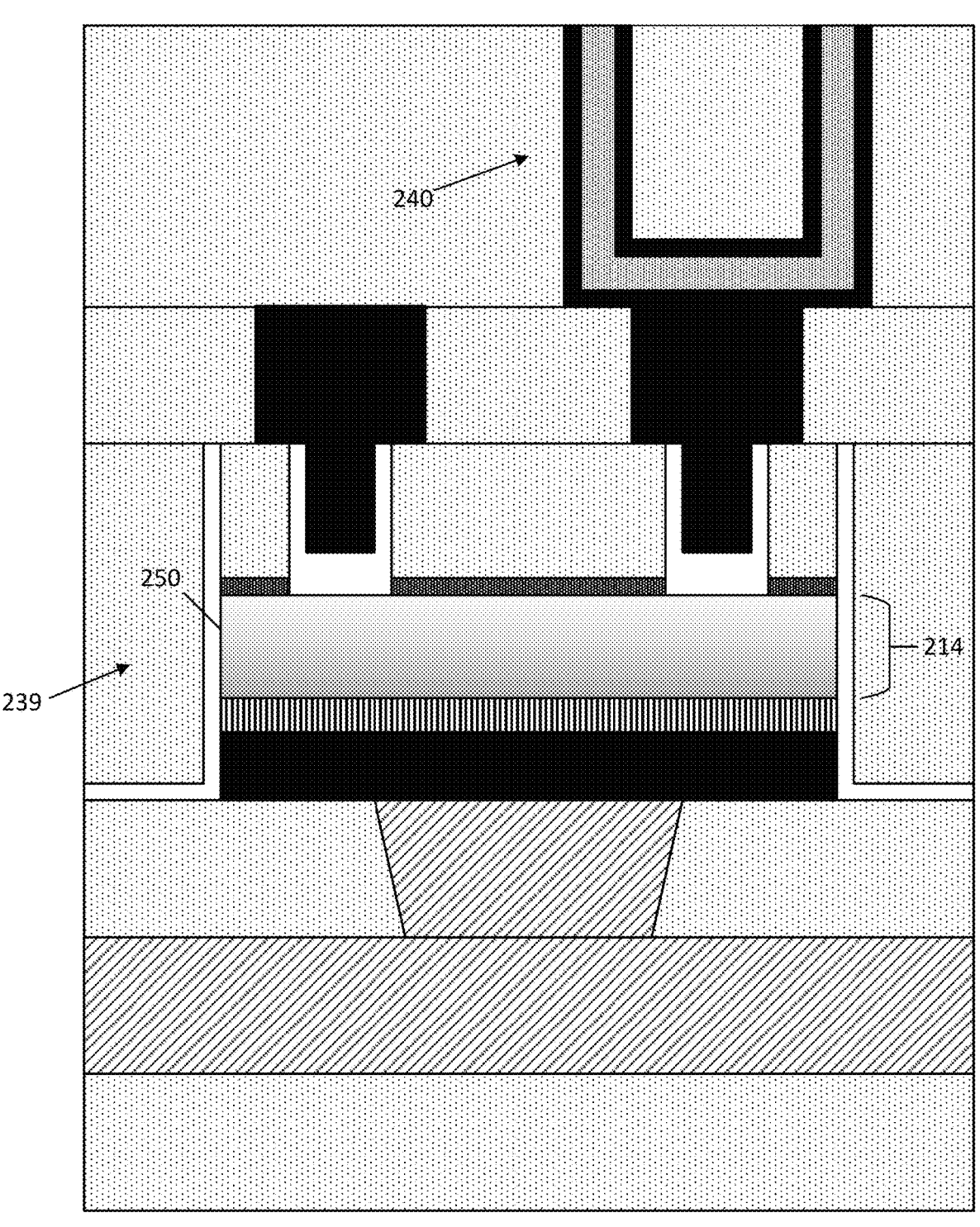
FIG. 2J"

400

FORM ELECTRODE LAYER ON AN UNDERLYING
INTERCONNECT LAYER — 402

FORM GATE DIELECTRIC ON GATE ELECTRODE — 404

FORM SEMICONDUCTOR REGION HAVING DIFFERENT
MATERIAL LAYERS OVER GATE DIELECTRIC — 406

FORM OTHER DIELECTRIC LAYERS OVER
SEMICONDUCTOR REGION — 408

FORM CONTACTS THROUGH THE OTHER DIELECTRIC
LAYERS TO CONTACT RESPECTIVE PORTIONS OF THE
SEMICONDUCTOR REGION — 410

MULTI-LAYERED OR GRADED SEMICONDUCTOR REGION IN THIN FILM TRANSISTOR (TFT) STRUCTURES

FIELD OF THE DISCLOSURE

The present disclosure relates to integrated circuits, and more particularly, to multilayer and/or or concentration gradient semiconductor regions in thin film transistor structures.

BACKGROUND

As integrated circuits continue to scale downward in size, a number of challenges arise. For instance, as transistor area decreases, so too do the dimensions for interconnects made to the various transistor structures, such as gate structures, drain regions, and source regions. Structures formed in such interconnect layers may be highly affected by process variations leading to subsequent variations in device performance or low yield of workable devices. Accordingly, there remain a number of non-trivial challenges with respect to the formation of backend structures in integrated circuits.

Figure 1A:
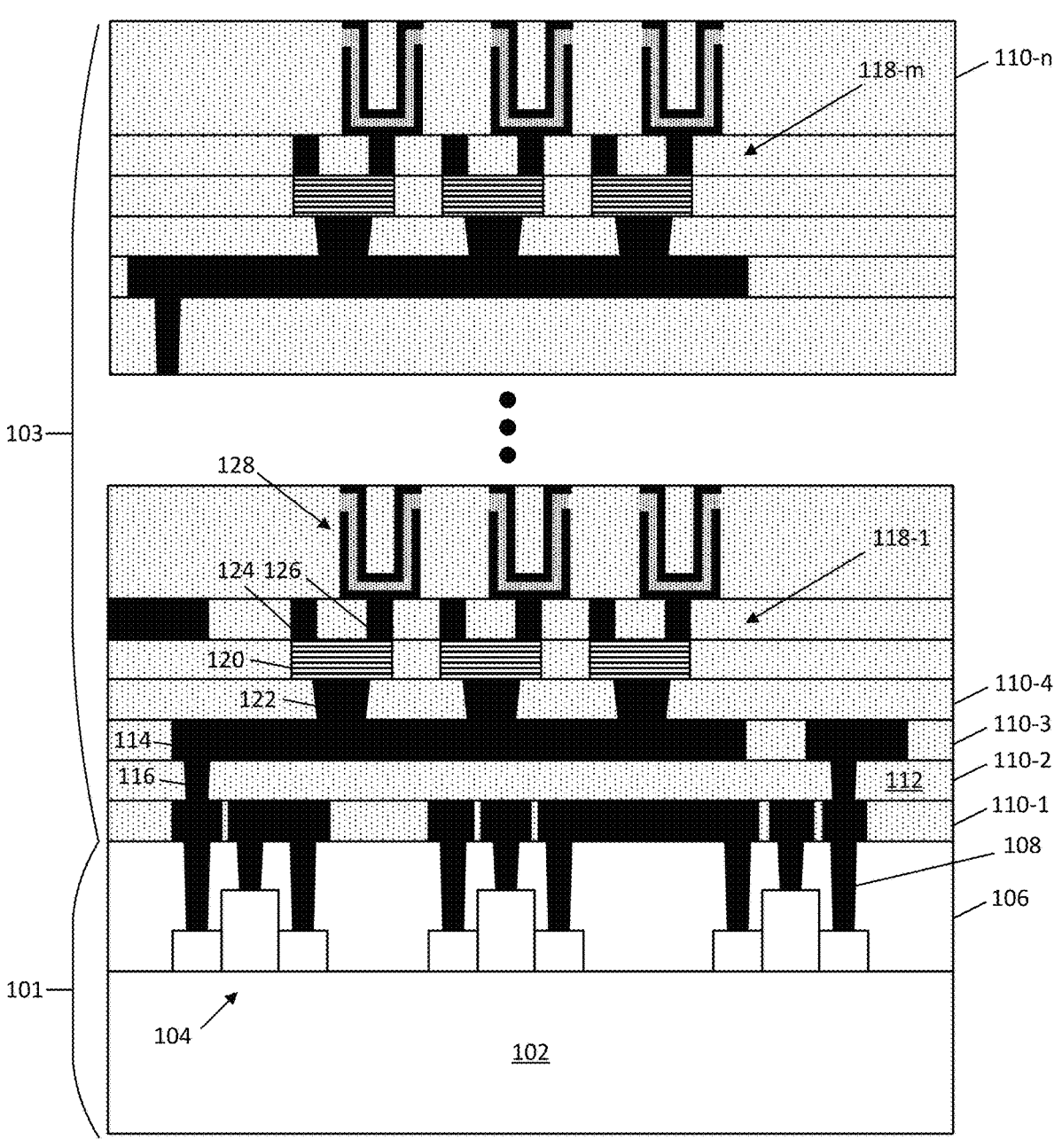
FIG. 1A is a cross-sectional view that illustrates an example portion of an integrated circuit configured with an interconnect region having tiers of memory structures that include thin film transistor structures having multilayer semiconductor regions, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein for forming thin film transistor structures having multilayer and/or concentration gradient semiconductor regions. While the techniques can be used in any number of applications, they are particularly useful in forming backend (e.g., within the interconnect region) memory structures configured with TFTs having a multi-layer and/or concentration gradient semiconductor region (sometimes called a channel region or channel layer or channel structure). Such a semiconductor region can be used, for instance, to reduce contact resistance and increase thermal stability. According to an example, a given memory structure generally includes memory cells, with each memory cell having an access device and a storage device. The access device may include, for example, a thin film transistor (TFT) structure, and the storage device may include a capacitor. In such cases, the TFT structure allows the capacitor to be accessed during write operations (to store a memory bit) and read operations (to read a previously-stored bit). According to some such embodiments, the memory structures are arranged in a two-dimensional array within one or more interconnect layers and stacked in a vertical direction such that multiple tiers of memory structure arrays are formed within the interconnect region. Any of the given TFT structures may include a multilayer semiconductor region that includes at least two or more different semiconductor layers and/or concentration gradient. The different layers (or concentration gradient(s) within a given layer, as the case may be) allow for different etch rates through each layer to controllably form contact recesses, according to some examples. Furthermore, the different layers and/or concentration gradient(s) can be tuned for higher mobility closer to the gate dielectric and for blocking leakage current. Numerous variations and embodiments will be apparent in light of this disclosure.

General Overview

As previously noted above, there are a number of non-trivial challenges with respect to forming backend structures within a given interconnect region of an integrated circuit. For example, landing the contact recesses directly on the semiconductor region of a TFT can be challenging. Over etching is typically performed to ensure break-through of dielectrics and any hard mask material to expose an adequate portion of the semiconductor region of the TFT. However, this leads to imprecise control of the contact etching into the semiconductor region, which leads to varying thicknesses and formation of unwanted defects. As a result, TFT performance can suffer due to inconsistent drive current between devices.

Thus, and in accordance with some embodiments of the present disclosure, techniques are provided herein to form a TFT structure having a multilayer and/or graded semiconductor region to tune the transistor performance. The TFT structure may be implemented, for example, in a backend memory structure and may be part of one memory structure of an array of similar memory structures formed within various levels of interconnect layers over semiconductor devices (e.g., transistors) of a previously-formed device layer. Any kind of memory structure configuration can be used, such as those that provide dynamic random-access memory (DRAM). According to some embodiments, a TFT structure includes a gate electrode, a gate dielectric over the gate electrode (for a backside gate configuration), a semiconductor or channel region (or channel structure) over the gate dielectric, and one or more contacts to the semiconductor region that act as source or drain regions for the transistor. Furthermore, in some embodiments, the semiconductor region includes multiple compositionally different layers that provide different advantages. For example, a top layer may have a higher conductivity compared to the other layers to decrease contact resistance between the semiconductor region and the conductive contacts. In another example, a bottom layer may have a high bandgap and be doped with materials to shift the threshold voltage. Since each of the layers of the semiconductor region can have their material composition adjusted individually, the overall stack can be adjusted to have any of a different etch selectivity between the layers, a different carrier mobility between the layers, and different doping profiles to improve thermal stability.

According to an embodiment, an integrated circuit includes a gate electrode, a gate dielectric on the gate electrode, and a semiconductor region on the gate dielectric. In some cases, the semiconductor region includes a plurality of compositionally different material layers, at least two layers of the different material layers each being a semiconductor layer. In some other cases, the semiconductor region includes a single layer having a material concentration gradient extending from a bottom surface of the single layer (adjacent to the gate dielectric) to a top surface of the single layer. The integrated circuit further includes first and second conductive contacts that each contact a respective portion of the semiconductor region.

In some such cases, the semiconductor region includes the single layer having the material concentration gradient and comprises an increasing gradient of indium from the bottom surface of the single layer to the top surface of the single layer, and a decreasing gradient of gallium from the bottom surface of the single layer to the top surface of the single layer. In some cases, the semiconductor region includes the single layer having the material concentration gradient and comprises one or both of (1) an increasing gradient of dopant from the bottom surface of the single layer to the top surface of the single layer, and (2) a decreasing gradient of a counter-dopant from the bottom surface of the single layer to the top surface of the single layer. In some cases, the semiconductor region includes the single layer having the material concentration gradient and comprises indium, gallium, zinc, and oxygen.

In still other such cases, the semiconductor region includes the plurality of compositionally different material layers and comprises a first semiconductor layer on the gate dielectric, a second semiconductor layer over the first semiconductor layer, and a third layer over the second semiconductor layer. In some such cases, the first and second conductive contacts extend through a thickness of the third layer and land on a top surface of the second semiconductor layer. In one such case, the third layer includes a dielectric material (such as a layer that includes oxygen and one of aluminum, indium, or silicon). In another case, the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration. In some such cases, the semiconductor material of each of the first, second, and third layers comprises indium, gallium, zinc, and oxygen. In some cases, the first semiconductor layer has a lower conductivity compared to the second semiconductor layer and the third layer. In still other cases, the third layer comprises a semiconductor material. Note that the first and second conductive contacts can land within the first, second or third layer, or on a top surface of the first, second or third layer, according to some such examples.

According to another embodiment, an integrated circuit includes a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor region on the gate dielectric, and first and second conductive contacts that each contact a respective portion of the semiconductor region. The semiconductor region includes a plurality of compositionally different material layers. At least two layers of the different material layers each includes a semiconductor material.

According to another embodiment, an integrated circuit includes a plurality of semiconductor devices, an interconnect region above the plurality of semiconductor devices and having a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor layer on the gate dielectric, and first and second conductive contacts that each contact a respective portion of the semiconductor layer. The semiconductor layer has a material concentration gradient extending from a bottom surface of the semiconductor layer adjacent to the gate dielectric to a top surface of the semiconductor layer.

According to another embodiment, a method of forming an integrated circuit includes forming an array of TFT structures across one or more interconnect above a plurality of semiconductor devices. Forming a given TFT structure of the array of TFT structures includes forming a gate electrode; forming a gate dielectric on the gate electrode; forming a first layer on the gate dielectric having a first semiconductor material; forming a second layer on the first semiconductor, the second layer having a second semiconductor material different from the first semiconductor material; forming a third material layer over the second layer; and forming at least one conductive contact through a thickness of the third material layer such that the at least one conductive contact lands on a top surface of the second layer or a top surface of the first layer.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX or EDS); secondary ion mass spectrometry (SIMS); time-of-flight SIMS (ToF-SIMS); atomic probe imaging or tomography (APT); local electrode atom probe (LEAP) techniques; 3D tomography; or high resolution physical or chemical analysis, to name a few suitable example analytical tools. For instance, in some example embodiments, such tools may indicate the presence of compositionally different material layers making up the semiconductor region of any backend TFT structure, or a material gradient within that semiconductor region. Electron scattering techniques, such as EDS, may be used to determine material composition of each of the different layers and determine that different material layers have been used, or to detect a material gradient. In some examples, APT may be used to determine thicknesses of each of the various material layers within the semiconductor region. ToF-SIMS can be used, for instance, to detect a material gradient within a single semiconductor layer.

It should be readily understood that the meaning of "above" and "over" in the present disclosure should be interpreted in the broadest manner such that "above" and "over" not only mean "directly on" something but also include the meaning of over something with an intermediate feature or a layer therebetween. The meaning of "on" or "directly on" in the present disclosure should be interpreted to mean something that is on something else with no intermediate feature or layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The integrated circuit or structure may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. Example layers include, for instance, a liner or barrier layer (e.g., a relatively thin layer of tantalum nitride), an etch stop layer (e.g., a relatively thin layer of silicon nitride), an interconnect layer (e.g., a relatively thick layer that includes dielectric material and one or more conductive interconnect features and/or active devices and/or passive devices), and a device layer (e.g., a relatively thick layer that includes metal oxide semiconductor field effect transistors or MOSFETs along with dielectric materials and conductive materials)

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations.

For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1A is a cross-sectional view that illustrates an example portion of an integrated circuit having an interconnect region 103 above a device region 101 that includes a plurality of semiconductor devices 104, in accordance with an embodiment of the present disclosure. As can be seen, the interconnect region 103 includes a number of memory cells each having access transistors configured with multilayer semiconductor regions (or channel regions or structures). The semiconductor devices 104 in this example are nonplanar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made). The semiconductor devices 104 may be configured for any number of functions, such as logic or compute transistors, I/O transistors, access or switching transistors, and/or radio frequency (RF) transistors, to name a few examples.

According to some embodiments, in addition to semiconductor devices 104, device region 101 may include, for example, one or more other layers or structures associated with the semiconductor devices 104. For example, device region 101 can also include a substrate 102 and one or more dielectric layers 106 that surround active and/or conductive portions of the semiconductor devices 104. Device region 101 may also include one or more conductive contacts 108 that provide electrical contact to transistor elements such as gate structures, drain regions, or source regions. Conductive contacts 108 may include, for example, tungsten, ruthenium, or copper, although other metal or metal alloy materials may be used as well. Some embodiments may include a local interconnect (e.g., via or line) that connects a given contact 108 to an interconnect feature within the interconnect region 103.

Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material from and/or upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, backside processing is used to remove substrate 102 and form additional backside interconnect layers. The techniques provided herein may be used to provide multi-tier memory structures within frontside and/or backside interconnect structures, as will be appreciated.

Interconnect region 103 includes any number (n) of interconnect layers 110-1 to 110-$n$ stacked over one another. Each interconnect layer can include a dielectric material 112 along with one or more different conductive interconnect features (e.g., vias and lines), active devices (e.g., transistors, diodes), and/or passive devices (e.g., capacitors, resistors, inductors). Dielectric material 112 can be any dielectric, such as silicon oxide, silicon oxycarbide, silicon nitride, or silicon oxynitride. Dielectric material 112 may be formed using any known dielectric deposition technique such as chemical vapor deposition (CVD), plasma-enhanced chemical vapor deposition (PECVD), flowable CVD, spin-on dielectric, or atomic layer deposition (ALD). The one or more conductive interconnect features can include any number of conductive traces 114 and conductive vias 116 arranged in any pattern across the interconnect layers 110-1 to 110-n to carry signal and/or power voltages to/from the various semiconductor devices 104. As used herein, conducive vias, such as conductive via 116, extend at least partially through an interconnect layer to connect between conductive traces on an upper interconnect layer and/or a lower interconnect layer, while conductive contacts, such as conductive contact 108, extend at least partially through a portion of dielectric layer 106 or any interconnect layer to contact one or more transistor elements. Interconnect layers are sometimes called metallization layers (e.g., such as M0 through M15). In some embodiments, a given metallization layer may include two adjacent interconnect layers with vias in one of the layers and metal traces in the other of the two layers.

Any of conductive traces 114 and conductive vias 116 can include any number of conductive materials, with some examples including copper, ruthenium, tungsten, cobalt, molybdenum, titanium, tantalum, and alloys thereof. In some example cases, any of conductive traces 114 and conductive vias 116 include a relatively thin liner or barrier, such as manganese, ruthenium, titanium nitride, titanium silicide, tungsten carbo-nitride (WCN), physical vapor deposited (PVD) or ALD tungsten, tantalum, or tantalum nitride, to name a few examples.

Note that each of the various conductive vias 116 and conductive contacts 108 are shown with tapered profiles to indicate a more natural appearance due to the etching process used to form the openings, although such tapering may not always be present. Any degree of tapering may be observed depending on the etch parameters used and the thickness of the dielectric layer being etched through. Furthermore, conductive vias may be stacked one over the other through different dielectric layers of interconnect region 103. However, in some examples, a single via recess may be formed through more than one dielectric layer yielding a taller, more tapered conductive via that extends through two or more dielectric layers (e.g., a deep via or supervia).

As can be further seen in this example embodiment, interconnect region 103 also includes tiers of memory arrays 118-1-118m, with each of the m memory arrays having any number of backend memory structures and/or capacitors. Each of the memory arrays may extend vertically across any number of interconnect layers (e.g., one, two or many). In some embodiments, a given memory array 118-1 includes a plurality of TFT structures 120 formed over a given conductive trace, such as conductive trace 114, extending in a first direction. According to some embodiments, a conductive via 122 extends between each TFT structure 120 along the illustrated row of TFT structures and conductive trace 114. In some other embodiments, the TFT structures 120 along the same row sit directly on conductive trace 114.

One or more second conductive traces 124 may each couple to a corresponding contact of a given TFT structure 120. Second conductive traces 124 may extend in a second direction orthogonal to the first direction. Conductive trace 114 may be, for example, a wordline of several parallel wordlines that extend beneath any number of TFT structures 120. Second conductive traces 124 may represent, for example, parallel bitlines extending into and out of the page and each connecting to the contacts of any number of TFT structures 120. TFT structures 120 can include any number of layers to form a transistor with a first source or drain region coupled to a corresponding second conductive trace 124 and a second source or drain region coupled to a conductive via 126. According to some embodiments, conductive via 126 acts as a conductive bridge between the second source or drain contact of a given TFT structure 120 and an electrode of its associated capacitor 128. Capacitors 128 may be, for example, metal-insulator-metal (MIM) capacitors having a U-shaped cross-section as shown, although other capacitor structures may be used as well (e.g., pillar-based capacitors with a dielectric layer sandwiched between an inner conductive core and an outer conductive layer, flat capacitors with a dielectric layer sandwiched between upper and lower conductive layers or between left and right conductive layers). Each capacitor 128 in tandem with its associated TFT structure 120 represents a single memory structure or memory cell for holding a single bit (e.g., a logic zero or one depending on the charge state of capacitor 128). This example shows TFT structure 120 contained within a single interconnect layer, but other embodiments may have TFT structures that extend vertically through two or more such interconnect layers. Further note that, in some embodiments, there is a relatively thin etch stop layer between adjacent interconnect layers, such as between any adjacent interconnect layers 110. Such etch stops may have a thickness in the range of, for example, 2 nm to 10 nm, and may include, for instance, silicon nitride, silicon oxynitride, or silicon oxycarbonitride, to name few examples.

As discussed above, the TFT structures 120 can suffer from process variations (especially when etching the recesses for the contacts), which can affect the drive current for each TFT structure 120. According to some embodiments, TFT structures 120 include a multi-layer semiconductor region that allows for tuning the device performance and providing a more consistent etch profile across multiple different devices of a given tier. Further details of the fabrication process for a single TFT-based memory structure, including the formation of the multiple and/or graded semiconductor layers in the TFT channel region, are provided herein with respect to FIGS. 2A-2J''.

Figure 1B:
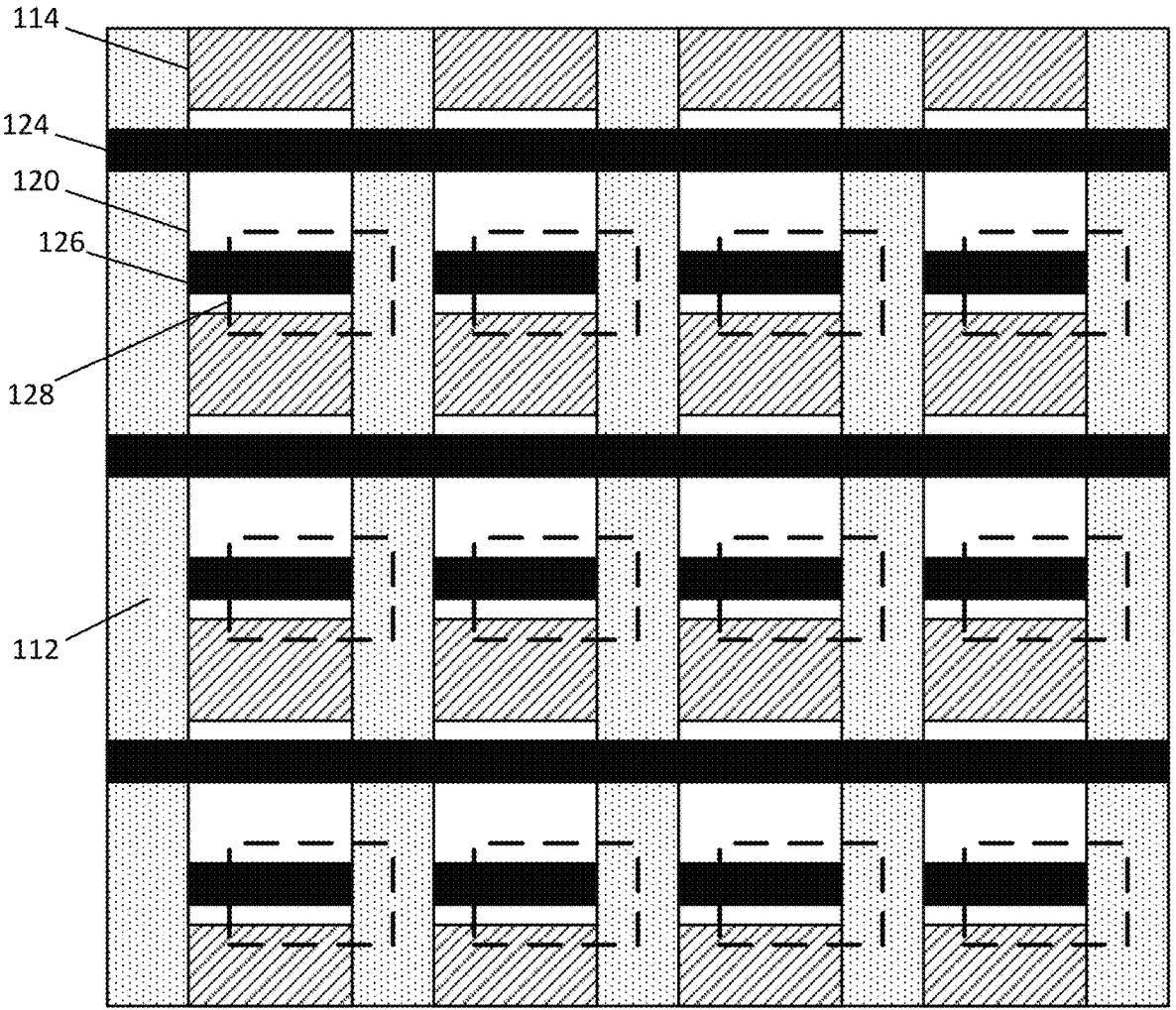
FIG. 1B is a plan view of an array of memory structures and generally illustrates structures formed across different interconnect layers, in accordance with an embodiment of the present disclosure.

FIG. 1B illustrates a plan view across an array of TFT-based memory structures, according to an embodiment. Many of the illustrated structures are located on or across different interconnect layers as shown in FIG. 1A but are all shown together in a single view in FIG. 1B for clarity. A plurality of parallel conductive traces 114 are present within a first interconnect layer and surrounded by dielectric material 112 within the first interconnect layer. Note in this view that the conductive traces 114 each run from the top to the bottom of the page (or vice-versa). According to some embodiments, dielectric material 112 is also present between any other structures on other interconnect layers, such as between adjacent TFT structures 120 and/or between adjacent capacitors 128.

TFT structures 120 are formed as individual islands in an array across the plurality of conductive traces 114, according to some embodiments. In this way, conductive traces 114 act as wordlines with each conductive trace 114 coupled to the gate(s) of one or more TFT structures 120 arranged along its length. In this example view, there are four conductive traces 114 shown, and there are three TFT structures 120 along the length of each conductive trace 114.

According to some embodiments, one of the source or drain contacts of TFT structures 120 in a same row are coupled to a same second conductive trace 124 that extends in a different direction (e.g., orthogonally) compared to conductive trace 114. A plurality of parallel second conductive traces 124 may each extend across any number of TFT structures and be coupled to the source or drain contact on each of the TFT structures in the row. In this example view, there are three conductive traces 124 shown, and there are four TFT structures 120 along the length of each conductive trace 124. Accordingly, any given TFT structure 120 of the array has its gate coupled to one of the conductive traces 114 (e.g., wordline) and one of its source or drain contacts coupled to one of the second conductive traces 124 (e.g., bitline) such that each of the TFT structures are individually addressable, in some examples. The other source or drain contact on each TFT structure 120 is coupled to its own conductive via 126, which acts like a conductive bridge between the TFT structure 120 and its corresponding capacitor 128. In an embodiment, TFT structures 120 are formed in a second interconnect layer over the first interconnect layer, second conductive traces 124 and conductive vias 126 are formed in a third interconnect layer over the second interconnect layer, and capacitors 128 are formed in a fourth interconnect layer over the third interconnect layer. In some other embodiments, note that one or more of TFT structures 120 may be a dummy structure (e.g., not connected into a working memory cell or otherwise non-functional).

Fabrication Methodology

FIGS. 2A-2J″ are cross-sectional views that collectively illustrate an example process for forming a portion of an interconnect region of an integrated circuit. According to an embodiment, the fabrication process for forming a 1T-1C memory structure in the interconnect region is provided. Each figure shows an example structure that results from the process flow up to that point in time, so the depicted structure evolves as the process flow continues, culminating in the structure shown in FIG. 2J (with alternate designs shown as FIGS. 2J′ and 2J″), which provides a detailed view of a single example TFT-based memory structure. The TFT-based memory structure may be one structure of a plurality of TFT-based memory structures across an array of memory structures (e.g., a single tier of memory structures). Each structure in the array may be formed together using the processes detailed here. Furthermore, as noted above, multiple tiers of memory arrays may be formed in the interconnect region. The TFT-based memory structures of each tier may be formed using the same processes discussed here.

The TFT-based memory structure may be part of an overall integrated circuit (e.g., such as a processor or memory chip, or a system-on-chip) that includes, for example, digital logic cells and/or memory cells and analog mixed signal circuitry. Example materials and process parameters are given, but other materials or parameters will be appreciated in light of this disclosure.

Figure 2A:
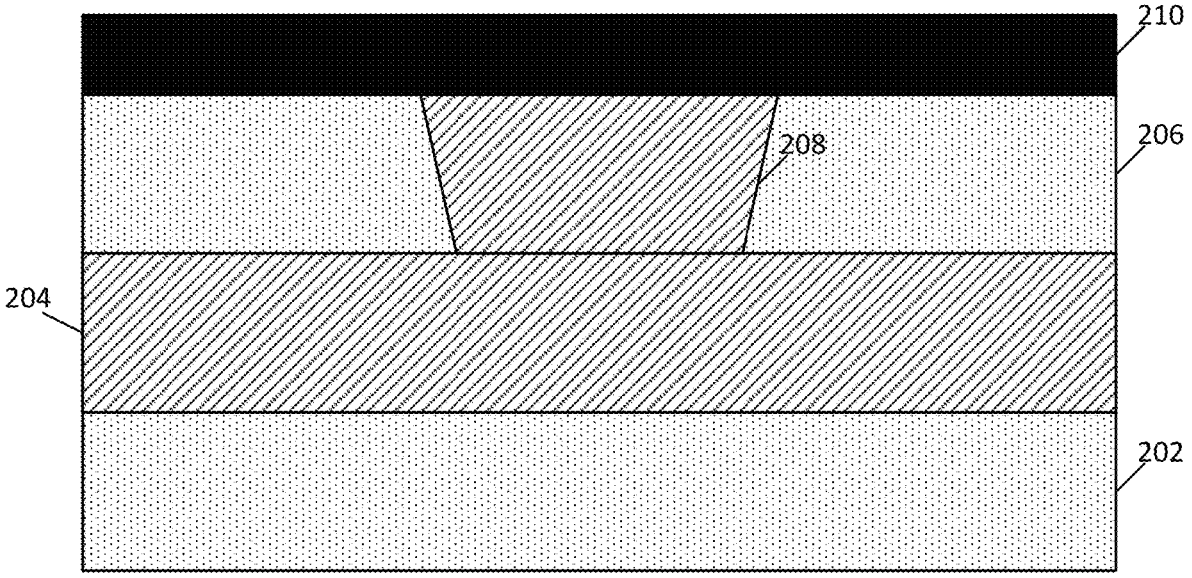
FIGS. 2A-2J" are cross-sectional views that collectively illustrate an example process for forming a thin film transistor (TFT) based memory structure having a multi-layer and/or concentration gradient semiconductor region, in accordance with an embodiment of the present disclosure.

FIG. 2A is a cross-sectional view taken through some interconnect layers of a plurality of stacked interconnect layers. Accordingly, any number of lower interconnect layers 202 may be at any position within interconnect region 103. Interconnect layers 202 may include any conductive traces and/or vias within any number of dielectric layers. According to some embodiments, a first interconnect layer includes a first conductive trace 204. As discussed above, first conductive trace 204 may be one wordline of a plurality of wordlines that run parallel to one another in the first interconnect layer. Other memory control/access schemes can be used as well.

First conductive trace 204 may be formed, for example, by first forming a recess within a surrounding dielectric layer (not shown) followed by filling the recess with a conductive material, such as copper, that is deposited using any one of electroplating, electroless plating, CVD, or PECVD, to name a few examples. After deposition of the conductive material within the recess, a polishing process may be performed using, for example, chemical mechanical polishing (CMP) to planarize the given layer down to a top surface of first conductive trace 204. In some embodiments, a thin barrier layer is conformally deposited (e.g., via ALD or CVD) first along the inner surfaces of the recess prior to the deposition of the copper or other conductive fill material. The thin barrier layer may include, for example, tantalum or titanium, or a nitride of these, or some other electromigration inhibitor.

According to some embodiments, another dielectric layer 206 is deposited over first conductive trace 204, and a conductive via 208 is formed within dielectric layer 206 such that conductive via 208 is on first conductive trace 204. In some embodiments, conductive via 208 is one via of a plurality of such conductive vias formed within dielectric layer 206 along a length of first conductive trace 204 and along a length of other such conductive traces parallel to first conductive trace 204.

According to some embodiments, a gate electrode 210 is deposited on dielectric layer 206 and a top surface of conductive via 208. In some other embodiments, dielectric layer 206 is omitted such that gate electrode 210 is deposited directly on first conductive trace 204. In either case, gate electrode 210 is conductively coupled to first conductive trace 204 (either directly or through conductive via 208). As will be appreciated, this particular example refers to a backside-gate configuration, where the gate structure of the access device being formed is on a backside of the device, and the source and drain contacts of that device are on a frontside of the device. Such a configuration facilitates connectivity within a given memory array (e.g., sandwiching a TFT device between a wordline and a bitline), but other connectivity schemes may be used if device density constraints allow for same.

Gate electrode 210 may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. Note that gate electrode 210 may contain multiple layers, such as an inner plug or fill metal, with surrounding or outer work function material. According to some embodiments, gate electrode 210 includes one or more n-type work function metals such as platinum, gold, palladium, or cobalt. In some embodiments, gate electrode 210 includes one or more p-type work function metals such as titanium, titanium nitride, tantalum, or tantalum nitride.

Figure 2B:
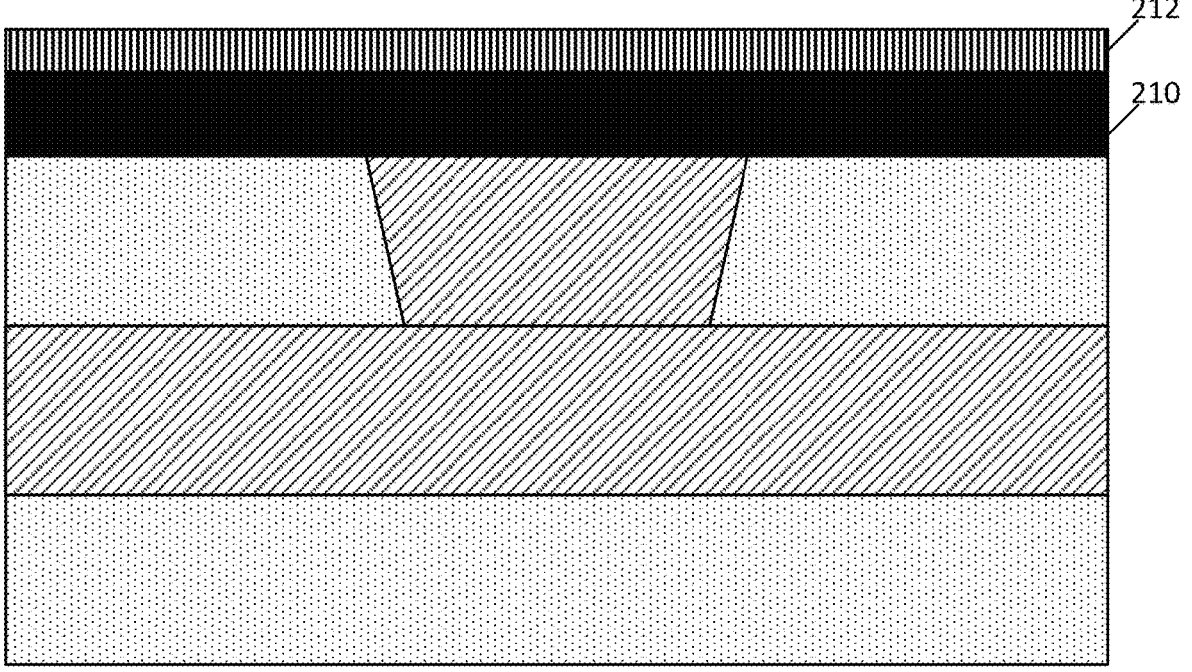

FIG. 2B is a cross-sectional view of the structure depicted in FIG. 2A after formation of a gate dielectric 212 over gate electrode 210. Gate dielectric 212 may be deposited, for example, to a thickness between about 2 nm and about 10. In some embodiments, gate dielectric 212 has a thickness up to about 50 nm. Gate dielectric 212 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, gate dielectric 212 may include multiple layers, such as a first layer of high-k material (e.g., hafnium oxide) on the gate electrode 210 and a second layer of lower-k oxide between the first layer and the channel layer that is ultimately formed over gate dielectric 212. The lower-k oxide may be, for instance, silicon oxide or an oxide of the channel layer material. Gate dielectric 212 may have a thickness between about 1 nm and about 10 nm.

Figure 2C:
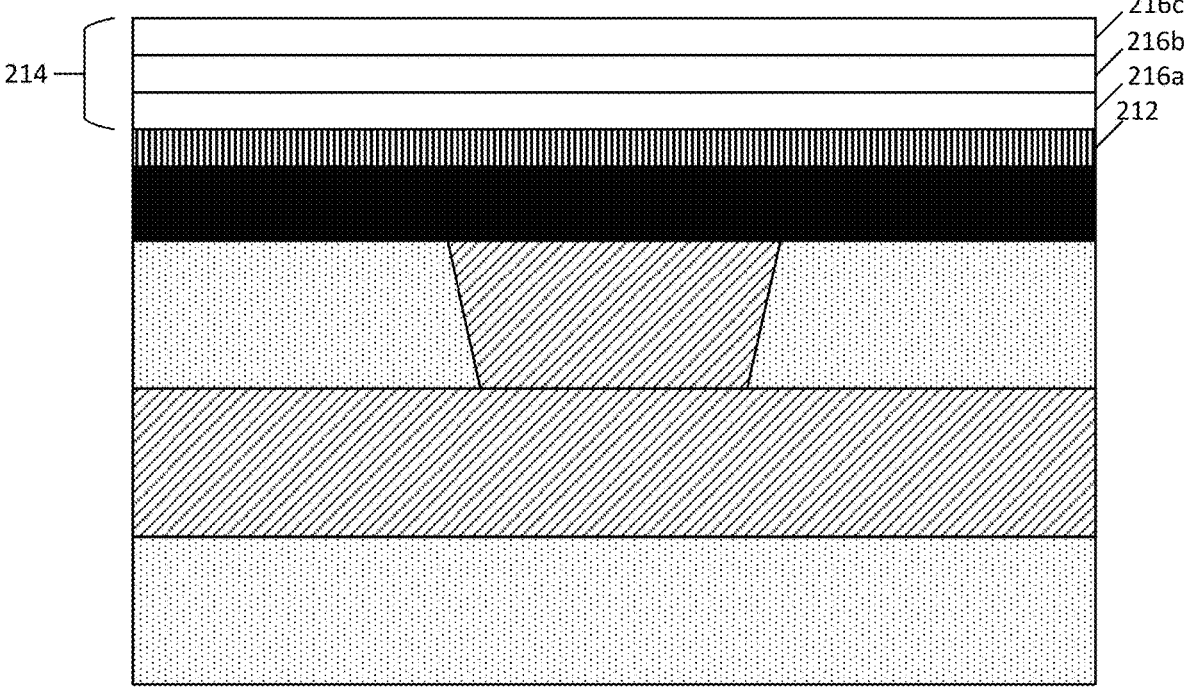

FIG. 2C is a cross-sectional view of the structure depicted in FIG. 2B after the formation of a semiconductor region 214 (also referred to as a channel layer or channel region) over gate dielectric 212. Semiconductor region 214 may include any suitable semiconductor material, such as silicon or any III-V or II-VI materials exhibiting semiconducting qualities. According to some embodiments, semiconductor region 214 includes any of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$ (silicon-boron-nitrogen), stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (sometimes referred to as c-IGZO), gallium zinc oxynitride (GaZnON), zinc oxynitride (ZnON), molybdenum and sulfur, a group-VI transition metal dichalcogenide, or a c-axis aligned crystal (CAAC) layer. Semiconductor region 214 may have a total thickness between about 5 nm and about 16 nm.

According to some embodiments, semiconductor region 214 includes a plurality of deposited layers 216a-216c with each layer having a different material composition and/or doping profile. Although only three layers are illustrated here, any number of layers may be deposited. Each of the various layers 216a-216c may be deposited using PVD and/or ALD. In some embodiments, one or more of the deposited layers include semiconductor materials with the same elements, but with differing concentrations to impart different characteristics to each layer. For example, a first layer 216a may include IGZO with a 1-4-1 concentration ratio of indium to gallium to zinc, a second layer 216b may include IGZO with a 1-2-1 concentration ratio of indium to gallium to zinc, and a third layer 216c may include IGZO with a 1-1-1 concentration ratio of indium to gallium to zinc. By successively lowering the gallium concentration in each additionally deposited layer, first layer 216a may exhibit a wider bandgap than the other layers while third layer 216c may exhibit a higher conductivity than the other layers. In other embodiments, the concentration of a different element, such as indium or zinc, is changed between successively deposited semiconductor layers. Although this example uses IGZO, any suitable metal oxide semiconductor material may be used with differing elemental concentrations between the layers, such as any of the semiconductor materials discussed above. In some embodiments, first layer 216a is any semiconductor layer having a lower conductivity compared to any other layer in semiconductor region 214 and/or that includes dopants to shift the threshold voltage higher compared to any threshold voltage shifts imparted by any of the other layers in semiconductor region 214. In some embodiments, first layer 216a is thinner than any of the other layers within semiconductor region 214. In some examples, first layer 216a is at least 50% thinner compared to either semiconductor layer 216b or layer 216c.

According to some embodiments, a topmost layer (e.g., third layer 216c) may include a dielectric material, such as aluminum oxide, indium oxide, or silicon oxide, to name a few examples. In such examples, third layer 216c may act as an etch stop for the formation of contact recesses, while a lower layer (e.g., second layer 216b) acts as the semiconductor channel for the transistor.

According to some embodiments, any one or more of the various layers 216a-216c can include a graded concentration of any element or elements (e.g., indium, gallium, or zinc) through a thickness of the layer. In one example, all of semiconductor region 214 includes a single graded layer.

Figure 2D:
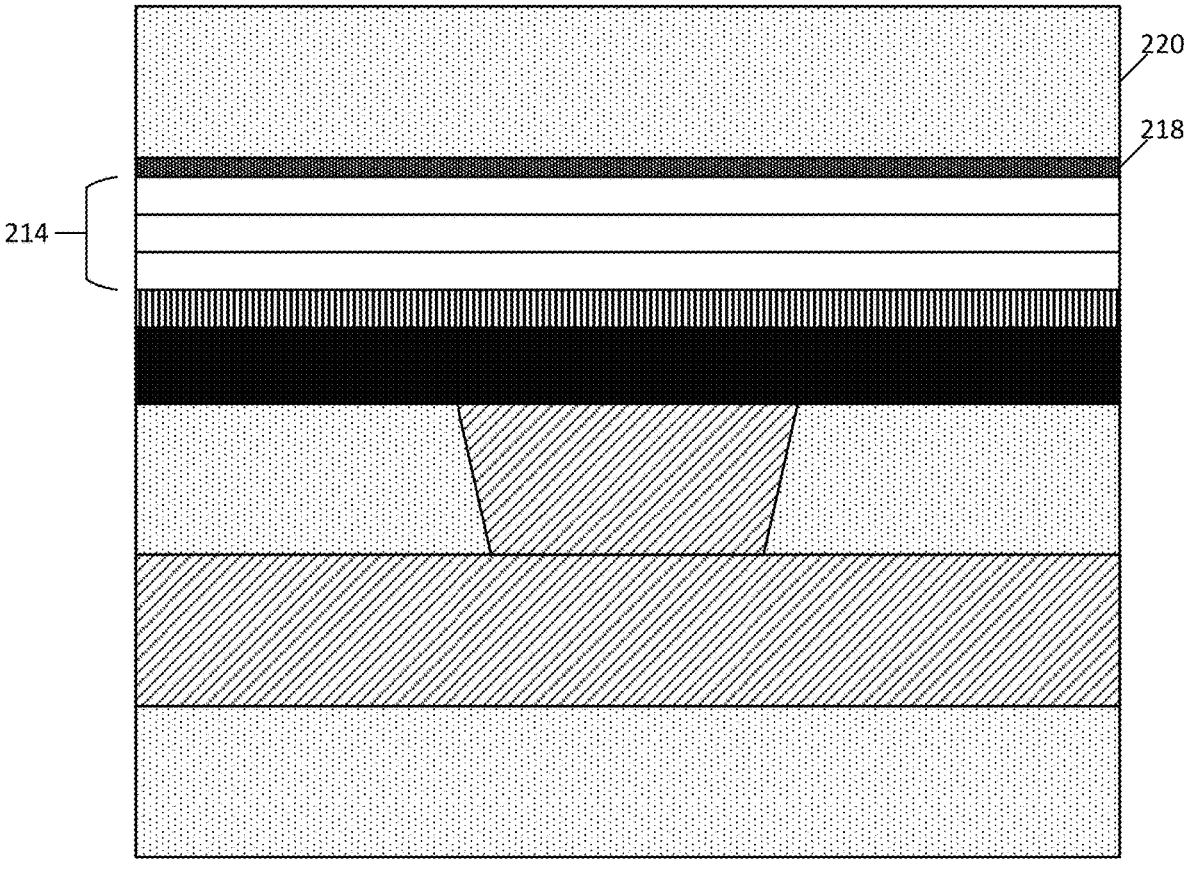

FIG. 2D is a cross-sectional view of the structure depicted in FIG. 2C after forming a passivation layer 218 and dielectric layer(s) 220. According to some embodiments, passivation layer 218 includes a dielectric material that protects the underlying semiconductor region 214. Passivation layer 218 may include, for example, aluminum oxide, although other metal oxides may be used as well. Dielectric layer(s) 220 represent any number of passivation and/or interlayer dielectrics (ILD) deposited over passivation layer 218. According to some embodiments, dielectric layer(s) 220 include the same material composition as dielectric material 112 in any interconnect layer. Dielectric layer(s) 220 may include, for instance, silicon oxide, silicon oxycarbide, silicon nitride, or silicon oxynitride, to name a few examples.

Figure 2E:
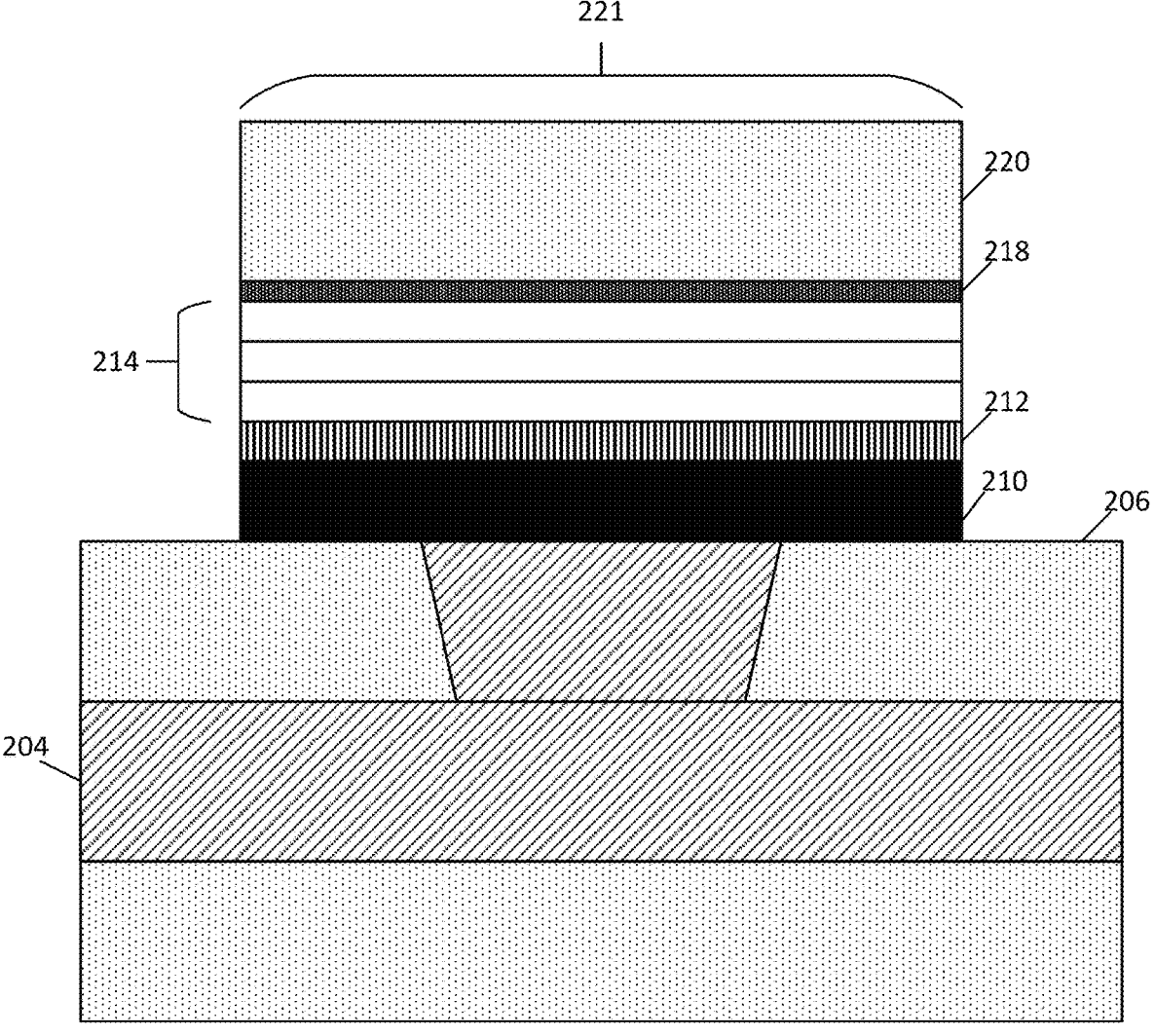

FIG. 2E is a cross-sectional view of the structure depicted in FIG. 2D after an etching process is performed to form an individual island of TFT layers 221. According to some embodiments, the etching process simultaneously forms multiple islands of TFT layers across any number of first conductive traces. An anisotropic etch may be performed to cut through a thickness of each of gate electrode 210, gate dielectric 212, semiconductor region 214, passivation layer 218, and dielectric layer(s) 220. In some embodiments, the etching process stops at a top surface of dielectric layer 206 or may stop after etching through a portion of dielectric layer 206. According to some embodiments, the etch depth at least cuts through an entire thickness of gate electrode 210. The full length of the resulting island of TFT layers 221 can vary from one embodiment to the next, but in some examples may be between about 50 nm and about 250 nm. In some embodiments, the distance between adjacent TFT layers 221 along a common first conductive trace 204 is between about 10 nm and about 50 nm.

Figure 2F:
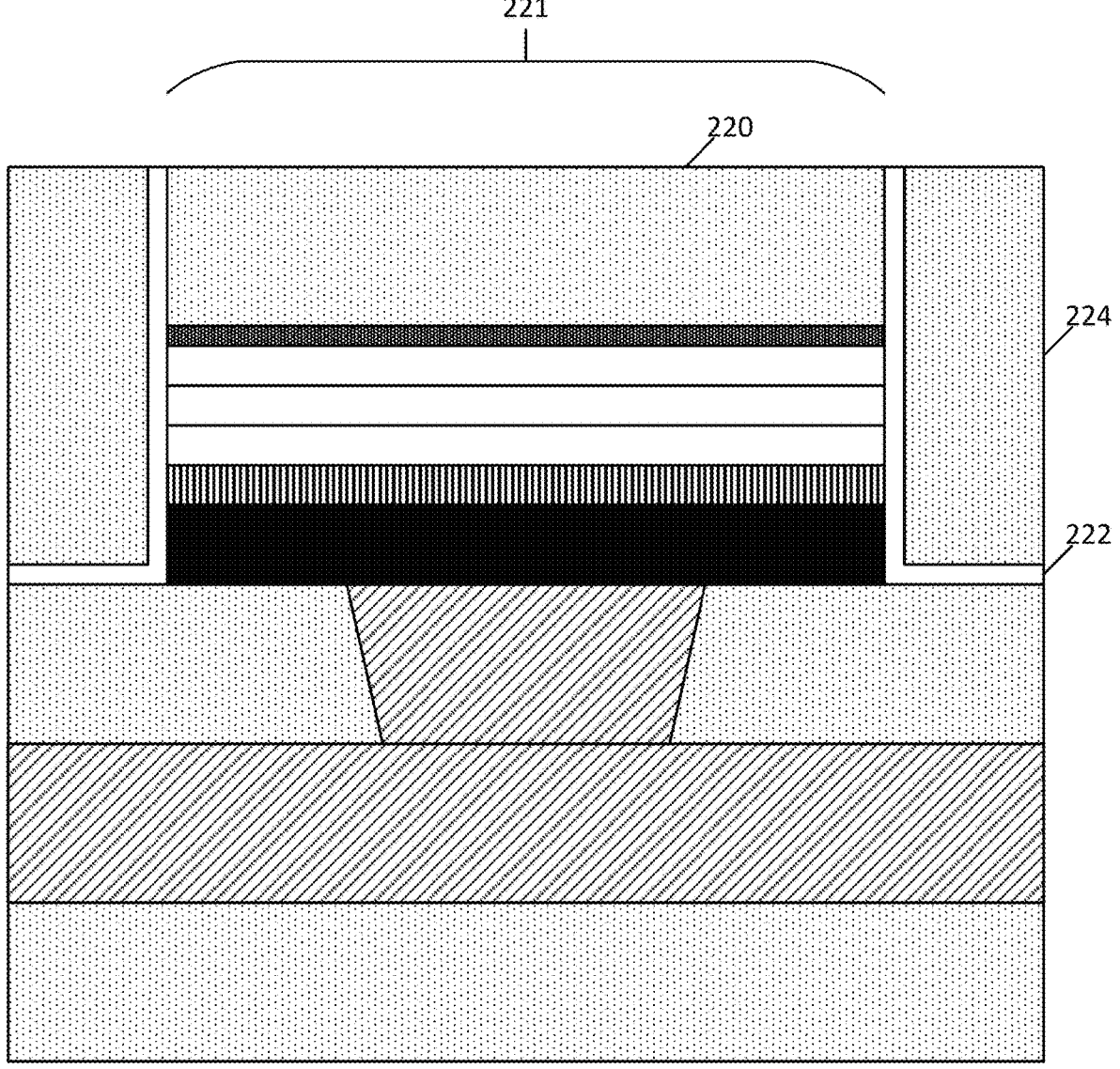

FIG. 2F is a cross-sectional view of the structure depicted in FIG. 2E following the formation of filler dielectric layers between adjacent islands of TFT layers 221, according to some embodiments. A dielectric liner 222 may be deposited over the sidewalls of TFT layers 221. According to some embodiments, dielectric liner 222 is a high-k material, such as hafnium oxide, with a thickness between about 0.5 nm and 5 nm. Other example materials for dielectric liner 222 include aluminum oxide, silicon nitride, silicon oxynitride, aluminum nitride, silicon carbide, silicon oxide, hafnium zirconium oxide, or zirconium oxide. A dielectric fill 224 may be formed within any remaining volume between adjacent islands of TFT layers 221 and over dielectric liner 222. Dielectric fill 224 may include any suitable dielectric material such as silicon oxide, or any other dielectric material used on any of the other interconnect layers. According to some embodiments, both dielectric liner 222 and dielectric fill 224 are deposited over the whole structure and then polished back using, for example, CMP to expose a top surface of dielectric layer(s) 220.

Figure 2G:
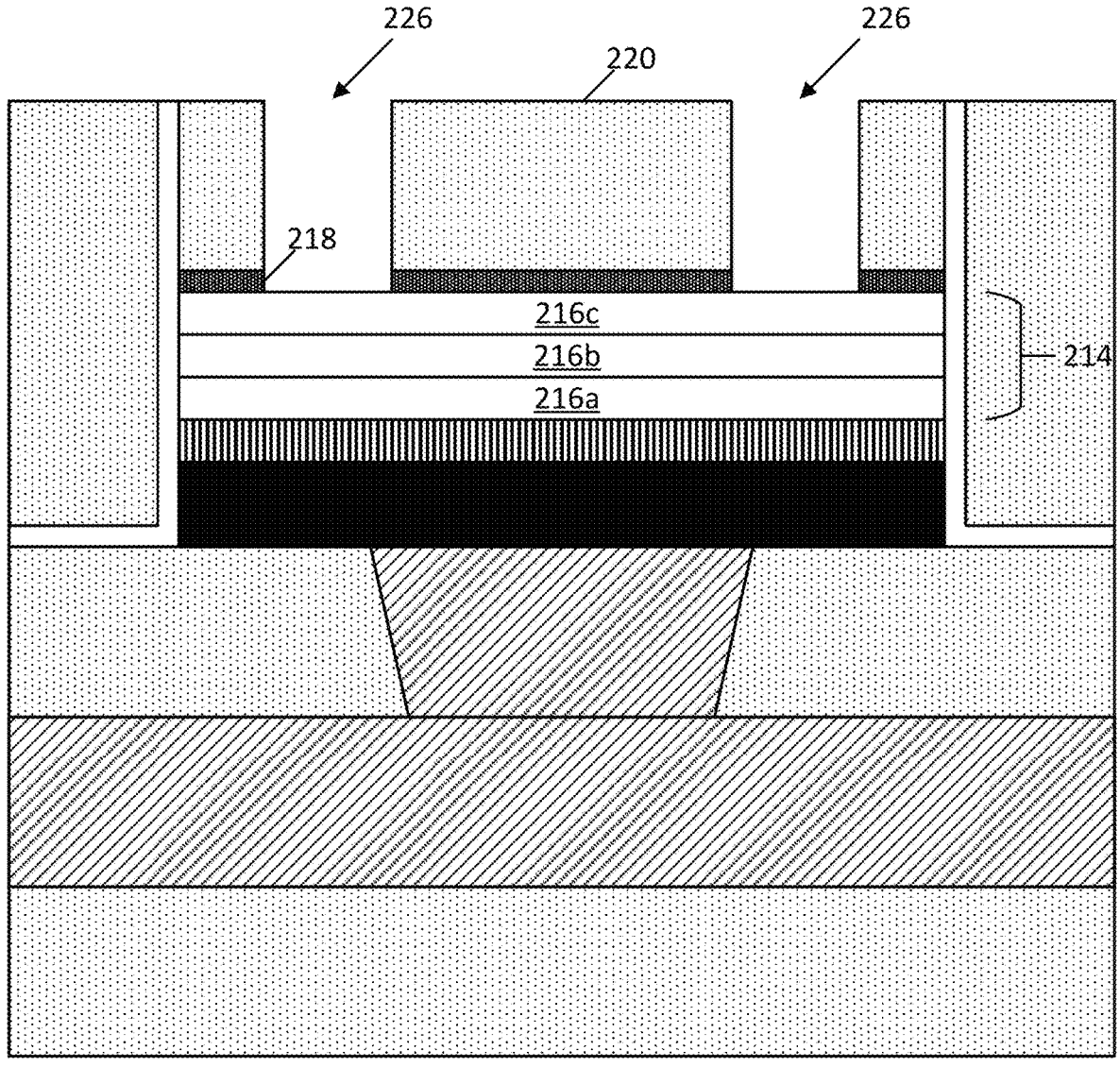

FIG. 2G is a cross-sectional view of the structure depicted in FIG. 2F following the formation of one or more contact recesses 226. According to one example, an anisotropic etching process may be performed through a thickness of at least dielectric layer(s) 220 and passivation layer 218 to expose at least a portion of a top surface of third layer 216c. Although recesses 226 are illustrated with straight walls, it should be understood that the etching process may yield inwardly tapered sidewalls. Recesses 226 may extend out to the edges of the TFT layers in the orthogonal direction (e.g., into and out of the page). In some embodiments, third layer 216c acts as an etch stop during the etching of recesses 226 to provide a more even etch profile across multiple devices. Afterwards, the exposed potion of third layer 216c in each of recesses 226 may be removed using, for example, an isotropic etching process that selectively removes the material of third layer 216c and exposes a lower layer (e.g., second layer 216b).

Figure 2H:
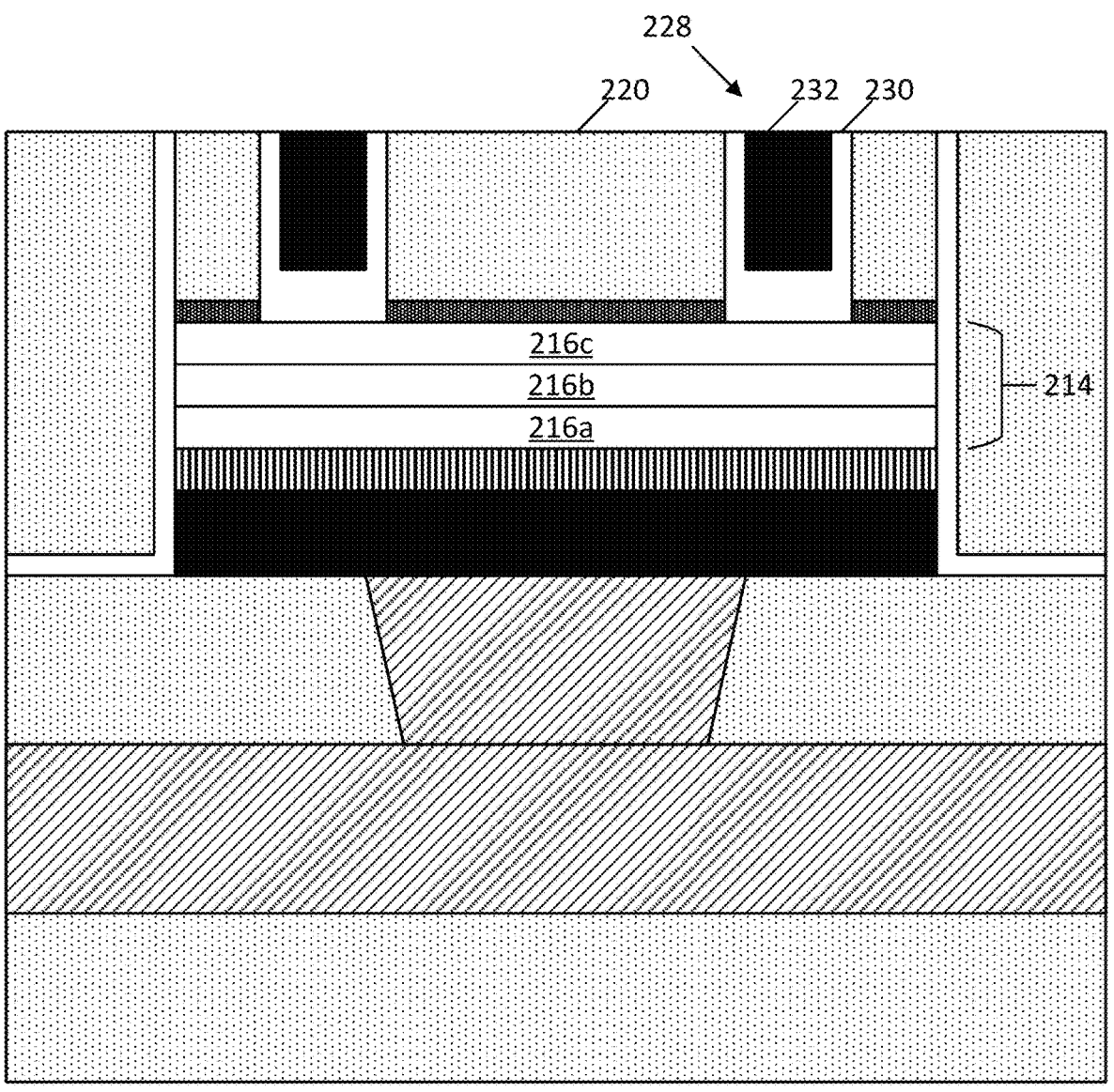

FIG. 2H is a cross-sectional view of the structure depicted in FIG. 2G following the formation of contacts 228 within contact recesses 226. According to some embodiments, contact 228 includes contact semiconductor layer(s) 230 and a metal fill 232. Contact semiconductor layer(s) 230 represent any number of formed semiconductor layers within recess 226, similar to semiconductor region 214. Accordingly, contact semiconductor layer(s) 230 may include silicon or any III-V or II-VI materials exhibiting semiconducting qualities. According to some embodiments, contact semiconductor layer(s) 230 includes metal oxide semiconductor material such as indium gallium zinc oxide (InGaZnO), indium zinc oxide (InZnO), indium oxide (InO), or gallium zinc oxide (GaZnO), to name a few examples. Like semiconductor region 214, contact semiconductor layer(s) 230 may include multiple formed semiconductor layers having varying properties to provide, for example, low contact resistance with semiconductor region 214, and a smoother energy bandgap transition with metal fill 232. According to some embodiments, contact semiconductor layer(s) 230 form along sidewalls of recess 226 and along a bottom surface of recess 226. The portion of contact semiconductor layer(s) 230 along the bottom surface of recess 226 may be thicker than the portion of contact semiconductor layer(s) 230 along sidewalls of recess 226.

Metal fill 232 may be any suitable interconnect contact metal, such as copper, ruthenium, tungsten, cobalt, molybdenum, titanium, tantalum, and alloys thereof. In some cases, metal fill 232 may be formed, for instance, using electroplating within the remaining volume of recess 226 following the formation of contact semiconductor layer(s) 230. Once both contact semiconductor layer(s) 230 and metal fill 232 have been formed within recess 226, they may both be polished back using, for example, CMP, to expose a top surface of dielectric layer(s) 220.

In some embodiments, contact 228 is formed directly on a top surface of third layer 216c. In such examples, third layer 216c may be a semiconductor layer exhibiting a higher conductivity compared to any of the other layers of semiconductor region 214. In some other embodiments, contact 228 extends through a thickness of third layer 216c and contacts a surface of a lower layer (e.g., second layer 216b). In such examples, third layer 216c may include a dielectric material while second layer 216b may be a semiconductor layer exhibiting a higher conductivity compared to any of the other layers of semiconductor region 214.

Figure 2I:
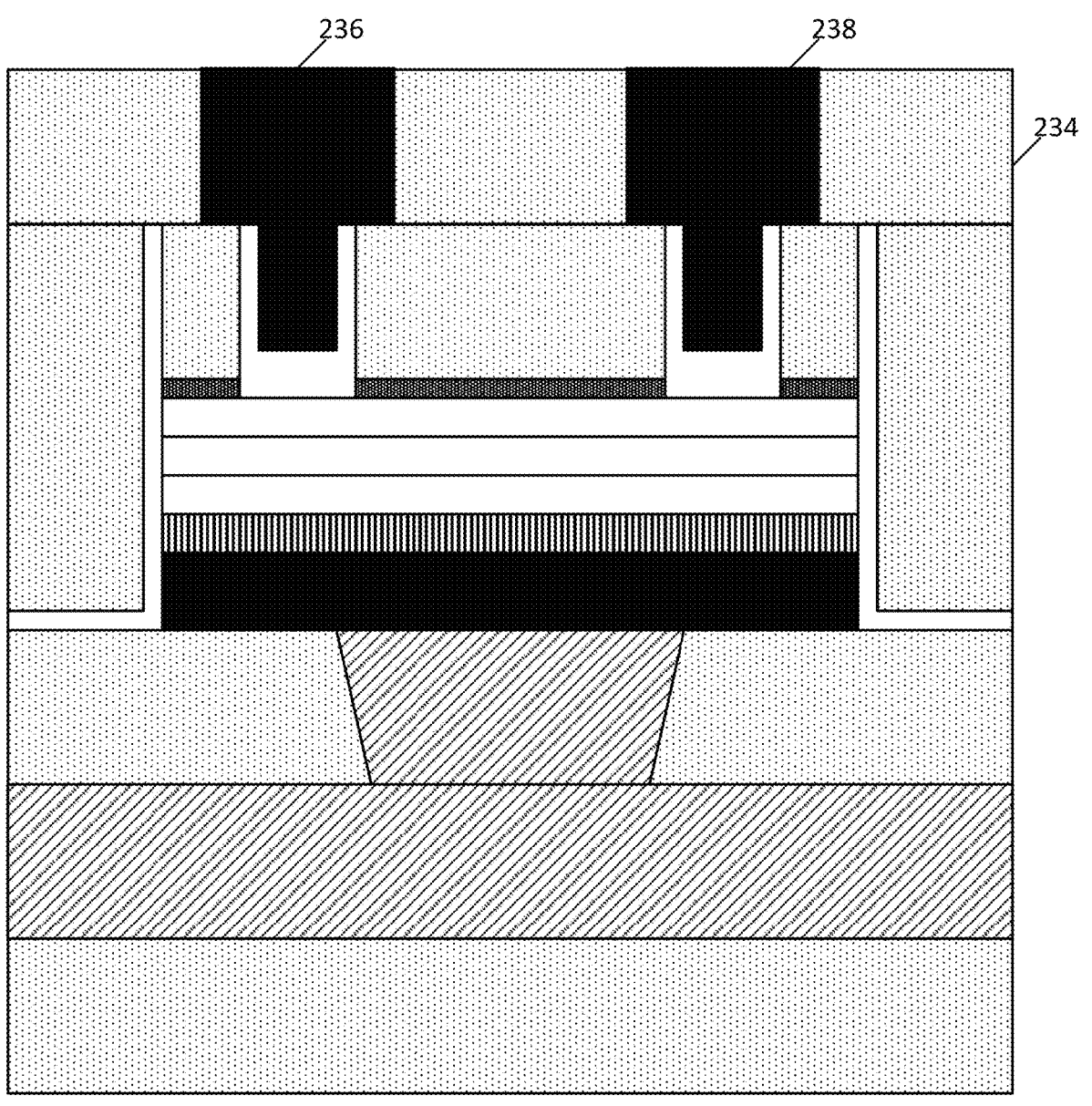

FIG. 2I is a cross-sectional view of the structure depicted in FIG. 2H following the formation of another interconnect layer 234 over the TFT structure. Interconnect layer 234 formed over the TFT structure includes a second conductive trace 236, a conductive via 238, and dielectric material surrounding the conductive features. The surrounding dielectric material may be similar to any other dielectric material (e.g., silicon dioxide or porous silicon dioxide) found in any of the other interconnect layers (such as dielectric material 112).

Second conductive trace 236 may be formed, for example, by first forming a recess within the surrounding dielectric material followed by filling the recess with a conductive material, such as copper, that is deposited using any one of electroplating, electroless plating, CVD, or PECVD, to name a few examples. After deposition of the conductive material within the recess, a polishing process may be performed using, for example, CMP to planarize a top surface of second conductive trace 240 with the surrounding dielectric material. In some embodiments, a thin barrier layer is conformally deposited (e.g., via ALD or CVD) first along the inner surfaces of the recess prior to the deposition of the remaining conductive material. The thin barrier layer may include, for example, tantalum or titanium, or a nitride of these. As discussed above, second conductive trace 236 may be one bitline of a plurality of parallel bitlines formed in the interconnect layer over the TFT structure. Accordingly, second conductive trace 240 may run into and out of the page orthogonally to first conductive trace 204. Second conductive trace 236 conductively contacts one of the contacts of the illustrated TFT structure and further contacts at least one of the contacts of other TFT structures along a row extending into and out of the page, according to some embodiments. Conductive via 238 may be conductively coupled only to one or more contacts of the illustrated TFT structure (and not coupled to any contacts of any other TFT structures). Conductive via 238 may include the same material composition and deposition process as second conductive trace 236.

Figure 2J:
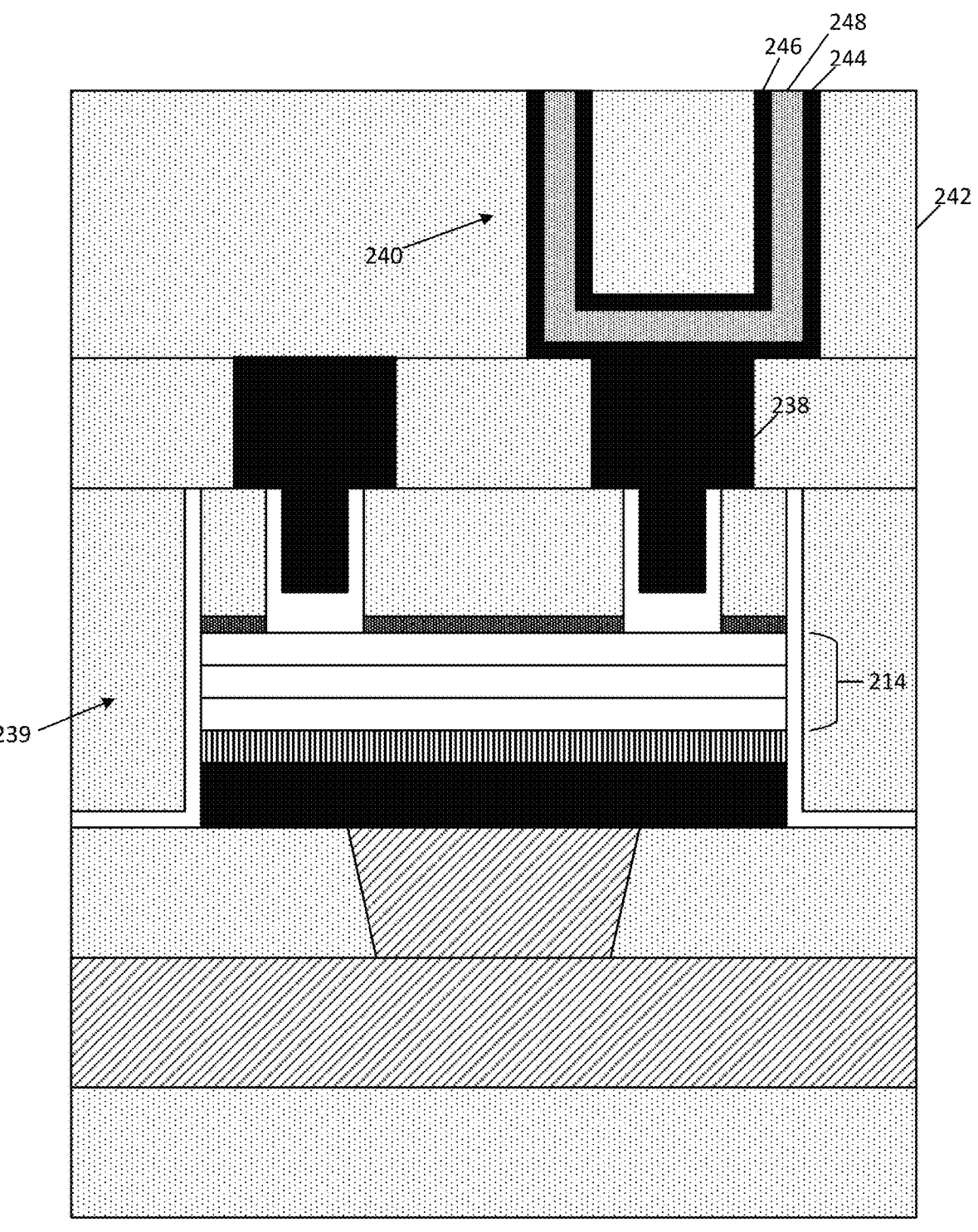
Figure 2J:
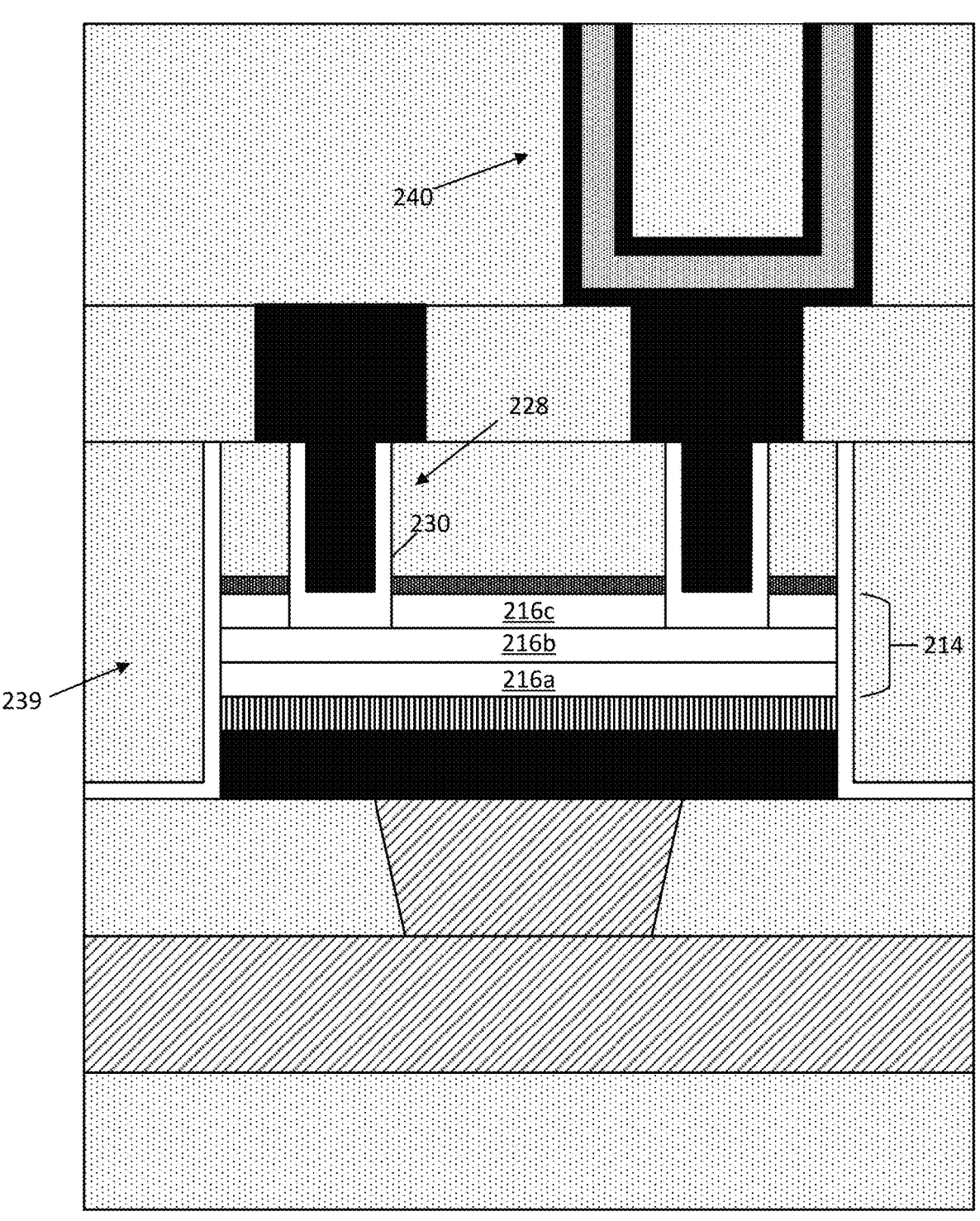

FIG. 2J is a cross-sectional view of the structure depicted in FIG. 2I following the formation of a capacitor 240 coupled to conductive via 238. As previously discussed, the TFT structure 239 is coupled to a corresponding capacitor 240 within another interconnect layer 242, and TFT structure 239 and capacitor 240, in combination, form or are part of a single memory structure (e.g., an eDRAM cell).

In the TFT-based memory structure, capacitor 240 stores a bit of information and TFT structure 239 allows for writing and reading that bit. For example, capacitor 240 can either be charged to a first state or discharged to a second state, and these two states represent two bit values of 0 or 1. As illustrated in FIG. 2J, capacitor 240 comprises a first electrode 244 and a second electrode 246. Electrodes 244 and 246 may be formed in a 'U' shape as illustrated to provide a high opposing surface area between the electrodes. In other embodiments, capacitor 240 may have a different shape or configuration. For instance, rather than being U-shaped, capacitor 240 may have a relatively flat configuration with upper and lower electrodes, or a pillar-shaped configuration with inner and outer electrodes. In one embodiment, electrodes 244 and 246 may include any suitable electrically conductive material, such as a metal or metal alloy material including, e.g., copper, silver, aluminum, tantalum, aluminum, tungsten, nickel, platinum, molybdenum, manganese, or an alloy thereof, such as titanium nitride, tantalum nitride, titanium aluminum nitride, molybdenum oxide, manganese oxide, ruthenium, tungsten oxide, or another appropriate conductive material.

According to some embodiments, one or more dielectric layers 248 are formed on electrode 244, prior to the formation of electrode 246. One or more dielectric layers 248 include any suitable dielectric material and form the "I" part of the MIM (metal-insulator-metal) capacitor 240. Note that one or more dielectric layers 248 may include one or more distinct and/or compositionally different layers of dielectric material. For example, one or more dielectric layers 248 may include one or more thin films of one or more metal oxides, such as one or more oxides of hafnium, aluminum, zirconium, titanium, tantalum, or another appropriate metal.

FIG. 2J' illustrates another example of TFT structure 239 where contacts 228 extend through third layer 216c and contact layer 216b of semiconductor region 214. As noted above, using third layer 216c as an etch stop produces more consistent contacts between various devices that each land at substantially the same thickness of semiconductor region 214 (e.g., at a top surface of second layer 216b).

FIG. 2J" illustrates another example of TFT structure 239 where a single graded layer 250 is provided as semiconductor region 214. According to some embodiments, graded layer 250 can include any number of graded dopants and/or semiconductor elements through a thickness of graded layer 250. In an example, graded layer 250 may include an increasing gradient of indium from a bottom surface to a top surface and also a decreasing gradient of gallium from the bottom surface to the top surface. In another example, graded layer 250 may include increasing gradient of dopant from the bottom surface of the layer 250 to the top surface of the layer 250, and/or a decreasing gradient of a counter-dopant from the bottom surface of the layer 250 to the top surface of the layer 250. Other gradient profiles can be used depending on the application. In some such examples, note that the effect of the gradient is to increase the conductivity of the upper portion of layer 250, to help lower contact resistance.

Figure 3:
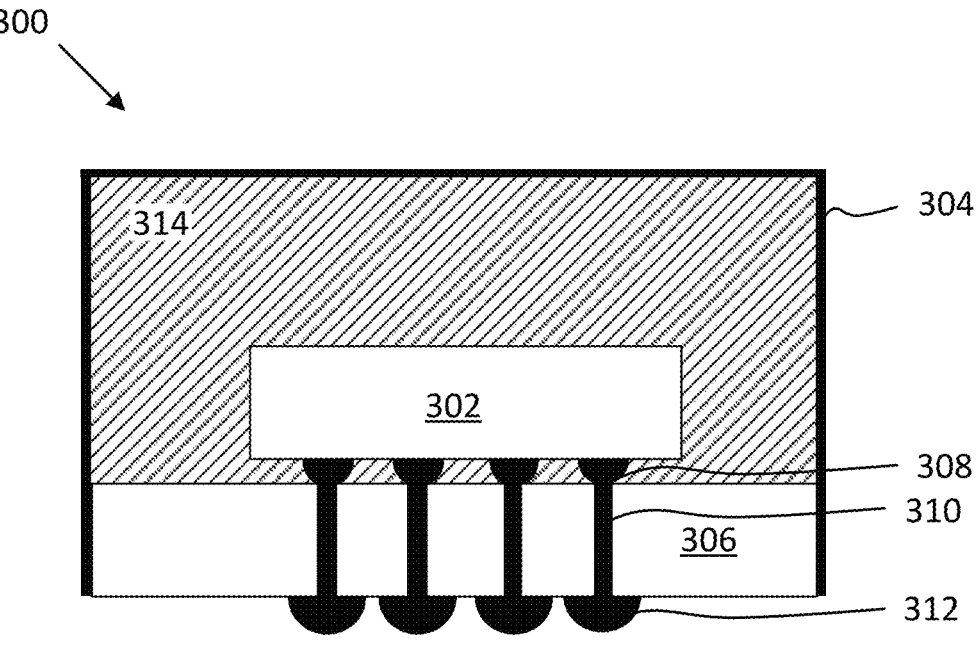
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having a structure as described in any of the aforementioned embodiments. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
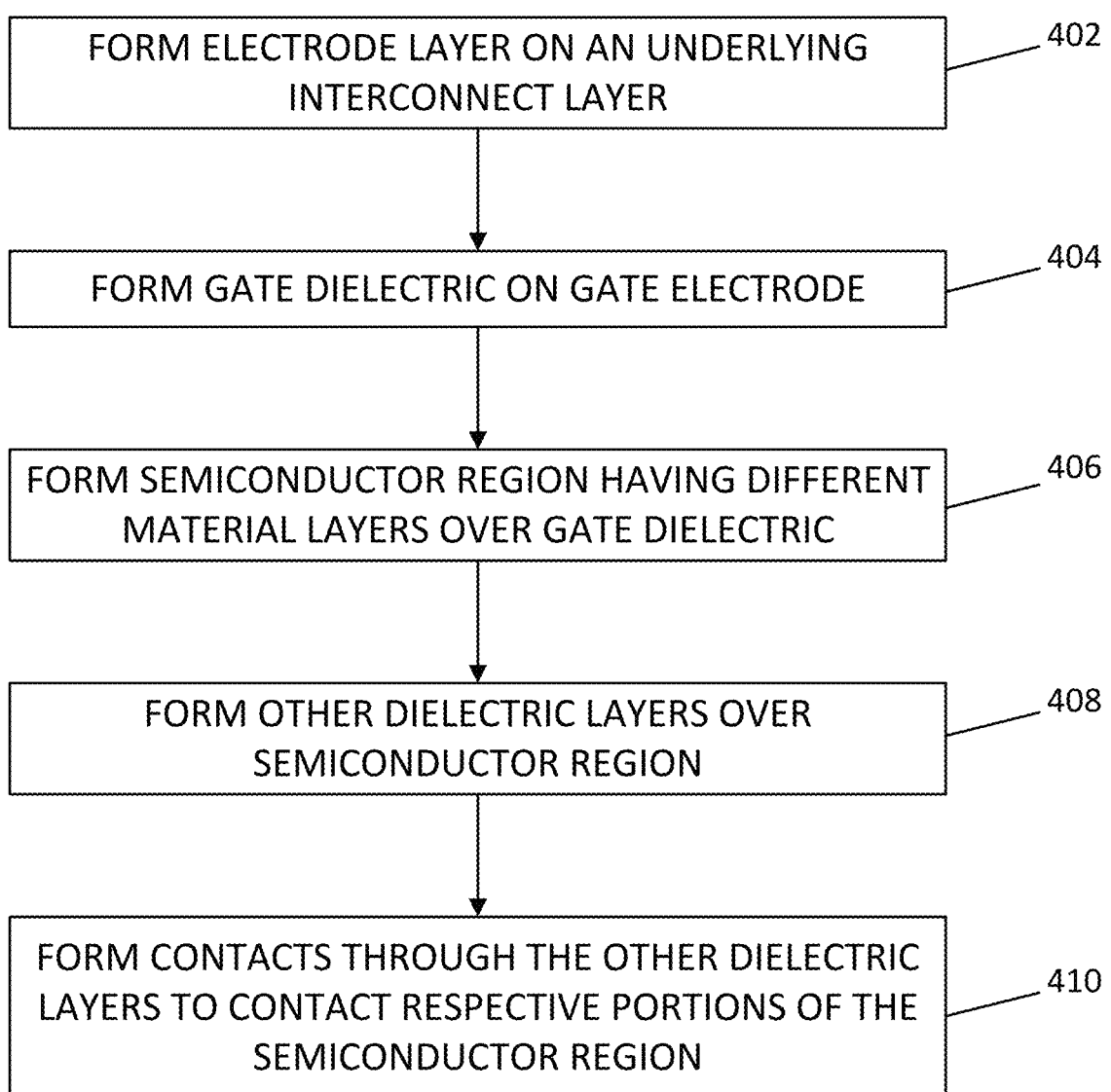
FIG. 4 is a flowchart of a method for forming a TFT structure having a multi-layer and/or concentration gradient semiconductor region, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2J". However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. Some of the operations of method 400 may be performed in a different order than the illustrated order. In some embodiments, the various operations of method 400 are performed during back end-of-the-line (BEOL) processing.

Method 400 begins with operation 402 where a gate electrode is formed on an underlying interconnect layer within an interconnect region. According to some embodiments, the gate electrode is formed directly on an underlying conductive via while in other embodiments the gate electrode is formed directly on an underlying conductive trace (e.g., a wordline). The gate electrode may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may contain multiple layers, such as an inner plug or fill metal, with surrounding or outer work function material. According to some embodiments, the gate electrode includes one or more n-type work function metals such as platinum, gold, palladium, or cobalt. In some embodiments, the gate electrode includes one or more p-type work function metals such as titanium, titanium nitride, tantalum, or tantalum nitride. The gate electrode may be deposited any suitable deposition technique, such as CVD, PVD, electroplating, or electroless plating.

Method 400 continues with operation 404 where a gate dielectric is formed over the gate electrode. The gate dielectric may be deposited, for example, to a thickness between about 2 nm and about 10. The gate dielectric may include any suitable dielectric material (such as silicon dioxide, and/or a high-k dielectric material) and deposited using any suitable deposition process, such as CVD, ALD, flowable CVD, or spin-on dielectric. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, the gate dielectric may include multiple different layers, such as a first layer of high-k material (e.g., hafnium oxide) on the gate electrode and at least one other layer of lower-k oxide between the first layer and the semiconductor region that is ultimately formed over the gate dielectric.

Method 400 continues with operation 406 where a semiconductor region is formed over the gate dielectric. The semiconductor region may include any suitable semiconductor material, such as silicon or any III-V or II-VI materials exhibiting semiconducting qualities. The semiconductor region may be deposited to a thickness between about 5 nm and about 16 nm using any suitable deposition technique, such as CVD, PECVD, PVD, ALD, or epitaxial growth, to name a few examples.

According to some embodiments, the semiconductor region includes a plurality of deposited layers with each layer having a different material composition and/or doping profile. In some examples, a topmost layer (or layers) of the semiconductor region includes a dielectric material.

In some embodiments, one or more of the deposited layers of the semiconductor region include semiconductor materials with the same elements, but with differing concentrations to impart different characteristics to each layer. Any suitable metal oxide semiconductor material may be used with differing elemental concentrations between the layers. In some embodiments, the first deposited layer (i.e., directly on the gate dielectric) is any semiconductor layer having a lower conductivity compared to any other layer in the semiconductor region and/or that includes dopants to shift the threshold voltage higher compared to any threshold voltage shifts imparted by any of the other layers in the semiconductor region. In some embodiments, the deposited layer is thinner than any of the other layers within the semiconductor region.

According to some embodiments, any one or more of the various layers of the semiconductor region can include a graded concentration of any element or elements (e.g., indium, gallium, or zinc) through a thickness of the layer. In one example, all of the semiconductor region includes a single graded layer.

Method 400 continues with operation 408 where other dielectric layers are formed over the semiconductor region. According to some embodiments, the other dielectric layers include a passivation layer having a dielectric material that protects the underlying semiconductor region. The passivation layer may include, for example, aluminum oxide, although other metal oxides may be used as well. Any number of passivation and/or interlayer dielectrics (ILD) can be deposited over the passivation layer. According to some embodiments, any of the other dielectric layers may include silicon oxide, silicon oxycarbide, silicon nitride, or silicon oxynitride, to name a few examples.

Method 400 continues with operation 410 where one or more conductive contacts are formed through the other dielectric layers, such that at least a portion of the one or more conductive contacts lands upon respective one or more portions of the semiconductor region. As discussed above, the conductive contacts may include one or more contact semiconductor layers and a metal fill. According to some embodiments, the one or more contacts land directly on a topmost layer of the semiconductor region. In some other embodiments, the one or more contacts extend through a thickness of any number of top layers within the semiconductor region and land upon another layer within the semiconductor region. In any case, the layer upon which the one or more contacts lands upon has a highest conductivity amongst all of the layers within the semiconductor region, according to some embodiments.

Example System

Figure 5:
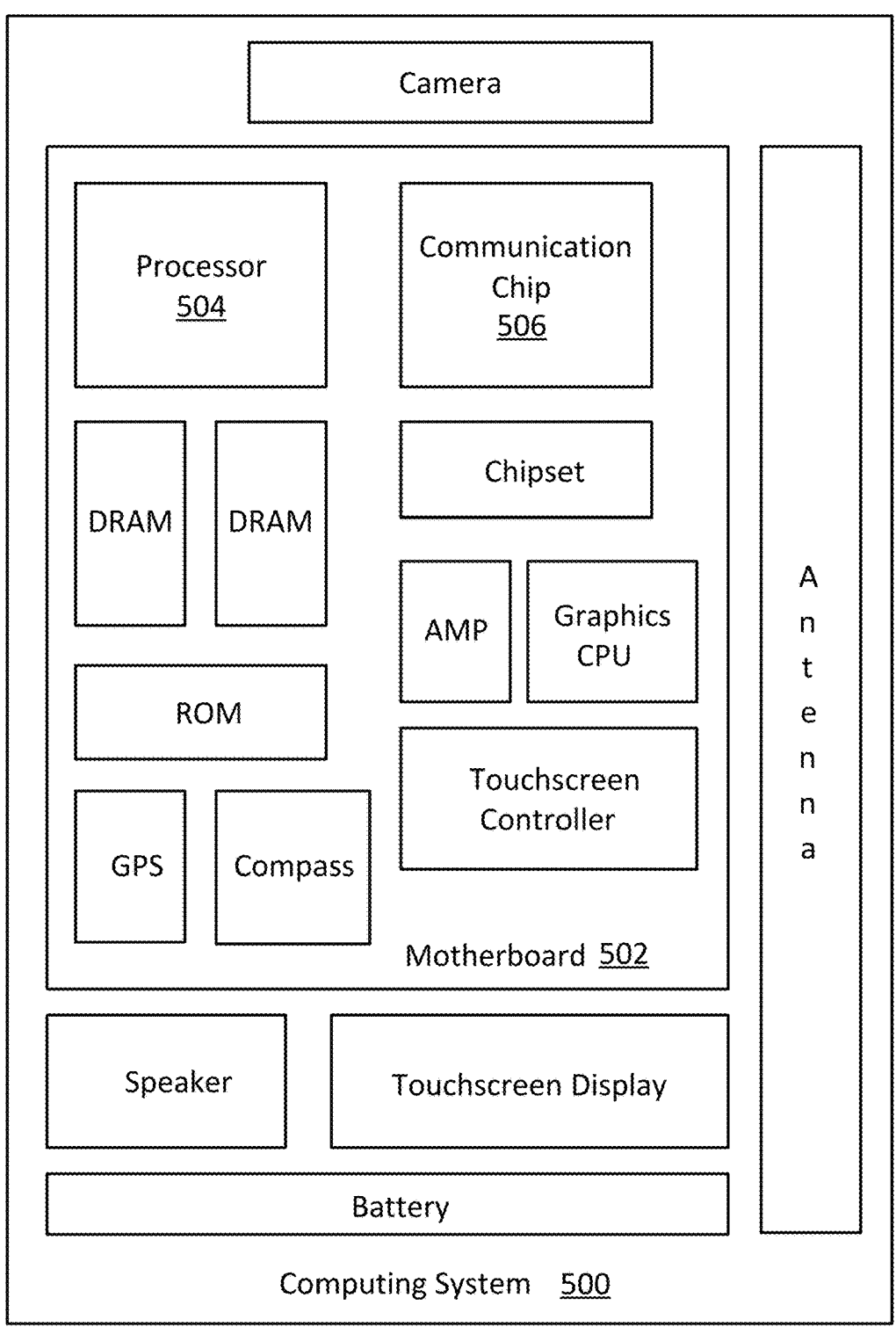
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit having interconnect structures that include tiers of backend memory cells having a multilayer and/or graded semiconductor region). In some embodiments, the inclusion of the backend memory cells may reduce the number of other DRAM chips included within computing system 500. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a gate electrode, a gate dielectric on the gate electrode, a semiconductor region on the gate dielectric, and first and second conductive contacts that each contact a respective portion of the semiconductor region. The semiconductor region includes one of (1) a plurality of compositionally different material layers, at least two layers of the different material layers each being a semiconductor layer, or (2) a single layer having a material concentration gradient extending from a bottom surface of the single layer adjacent to the gate dielectric to a top surface of the single layer.

Example 2 includes the subject matter of Example 1, wherein the semiconductor region includes the single layer having the material concentration gradient and comprises an increasing gradient of indium from the bottom surface of the single layer to the top surface of the single layer, and a decreasing gradient of gallium from the bottom surface of the single layer to the top surface of the single layer.

Example 3 includes the subject matter of Example 1 or 2, wherein the semiconductor region includes the single layer having the material concentration gradient and comprises one or both of (1) an increasing gradient of dopant from the bottom surface of the single layer to the top surface of the single layer, and (2) a decreasing gradient of a counterdopant from the bottom surface of the single layer to the top surface of the single layer.

Example 4 includes the subject matter of any one of Examples 1-3, wherein the semiconductor region includes the single layer having the material concentration gradient and comprises indium, gallium, zinc, and oxygen.

Example 5 includes the subject matter of any one of Examples 1-4, wherein the semiconductor region includes the plurality of compositionally different material layers and comprises a first semiconductor layer on the gate dielectric, a second semiconductor layer over the first semiconductor layer, and a third layer over the second semiconductor layer.

Example 6 includes the subject matter of Example 5, wherein the first and second conductive contacts extend through a thickness of the third layer and land on a top surface of the second semiconductor layer.

Example 7 includes the subject matter of Example 5 or 6, wherein the third layer comprises a dielectric material.

Example 8 includes the subject matter of Example 7, wherein the third layer comprises oxygen and one of aluminum, indium, or silicon.

Example 9 includes the subject matter of any one of Examples 5-8, wherein the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration.

Example 10 includes the subject matter of Example 9, wherein the semiconductor material of each of the first, second, and third layers comprises indium, gallium, zinc, and oxygen.

Example 11 includes the subject matter of Example 5, wherein the first semiconductor layer has a lower conductivity compared to the second semiconductor layer and the third layer.

Example 12 includes the subject matter of Example 5, wherein the third layer comprises a semiconductor material.

Example 13 includes the subject matter of Example 12, wherein the first and second conductive contacts land within the first, second or third layer, or on a top surface of the first, second or third layer.

Example 14 includes the subject matter of any one of Examples 1-13, wherein the first and second contacts each comprise a barrier layer and a metal fill.

Example 15 includes the subject matter of Example 14, wherein the barrier layer comprises a semiconductor material and the metal fill comprises copper.

Example 16 includes the subject matter of Example 15, wherein the semiconductor material of the barrier layer has a same composition as the semiconductor material of at least one of the layers of the semiconductor region.

Example 17 is a printed circuit board comprising the integrated circuit of any one of Examples 1-16.

Example 18 is an integrated circuit having a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor region on the gate dielectric, and first and second conductive contacts that each contact a respective portion of the semiconductor region. The semiconductor region includes a plurality of compositionally different material layers. At least two layers of the different material layers each includes a semiconductor material.

Example 19 includes the subject matter of Example 18, wherein the TFT structure further comprises a passivation layer over the semiconductor region, such that the first and second conductive contacts extend through an entire thickness of the passivation layer.

Example 20 includes the subject matter of Example 19, wherein the passivation layer comprises aluminum and oxygen.

Example 21 includes the subject matter of any one of Examples 18-20, wherein the semiconductor region comprises a first semiconductor layer on the gate dielectric, a second semiconductor layer over the first semiconductor layer, and a third layer over the second semiconductor layer.

Example 22 includes the subject matter of Example 21, wherein the first and second conductive contacts extend through a thickness of the third layer and land on a top surface of the second semiconductor layer.

Example 23 includes the subject matter of Example 22, wherein the third layer comprises a dielectric material.

Example 24 includes the subject matter of Example 23, wherein the third layer comprises oxygen and one of aluminum, indium, or silicon.

Example 25 includes the subject matter of Example 21, wherein the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration.

Example 26 includes the subject matter of Example 25, wherein the semiconductor material of each of the first, second, and third layers comprises indium, gallium, zinc, and oxygen.

Example 27 includes the subject matter of Example 21, wherein the first semiconductor layer has a lower conductivity compared to the second semiconductor layer and the third layer.

Example 28 includes the subject matter of any one of Examples 18-27, wherein the first and second contacts each comprise a barrier layer and a metal fill.

Example 29 includes the subject matter of Example 28, wherein the barrier layer comprises a semiconductor material and the metal fill comprises copper.

Example 30 includes the subject matter of Example 29, wherein the semiconductor material of the barrier layer has a same composition as the semiconductor material of at least one of the layers of the semiconductor region.

Example 31 is a printed circuit board comprising the integrated circuit of any one of Examples 18-30.

Example 32 is an electronic device that includes a chip package comprising one or more dies. At least one of the one or more dies includes a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor region on the gate dielectric, and first and second conductive contacts that each contact a respective portion of the semiconductor region. The semiconductor region includes a plurality of compositionally different material layers. At least two layers of the different material layers each includes a semiconductor material.

Example 33 includes the subject matter of Example 32, wherein the TFT structure further comprises a passivation layer over the semiconductor region, such that the first and second conductive contacts extend through an entire thickness of the passivation layer.

Example 34 includes the subject matter of Example 33, wherein the passivation layer comprises aluminum and oxygen.

Example 35 includes the subject matter of any one of Examples 32-34, wherein the semiconductor region comprises a first semiconductor layer on the gate dielectric, a second semiconductor layer over the first semiconductor layer, and a third layer over the second semiconductor layer.

Example 36 includes the subject matter of Example 35, wherein the first and second conductive contacts extend through a thickness of the third layer and land on a top surface of the second semiconductor layer.

Example 37 includes the subject matter of Example 36, wherein the third layer comprises a dielectric material.

Example 38 includes the subject matter of Example 37, wherein the third layer comprises oxygen and one of aluminum, indium, or silicon.

Example 39 includes the subject matter of Example 35, wherein the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration.

Example 40 includes the subject matter of Example 39, wherein the semiconductor material of each of the first, second, and third layers comprises indium, gallium, zinc, and oxygen.

Example 41 includes the subject matter of Example 35, wherein the first semiconductor layer has a lower conductivity compared to the second semiconductor layer and the third layer.

Example 42 includes the subject matter of any one of Examples 32-41, wherein the first and second contacts each comprise a barrier layer and a metal fill.

Example 43 includes the subject matter of Example 42, wherein the barrier layer comprises a semiconductor material and the metal fill comprises copper.

Example 44 includes the subject matter of Example 43, wherein the semiconductor material of the barrier layer has a same composition as the semiconductor material of at least one of the layers of the semiconductor region.

Example 45 includes the subject matter of any one of Examples 32-43, further comprising a printed circuit board, wherein the chip package is attached to the printed circuit board.

Example 46 is a method of forming an integrated circuit. The method includes forming an array of TFT structures across one or more interconnect above a plurality of semiconductor devices. Forming a given TFT structure of the array of TFT structures includes forming a gate electrode; forming a gate dielectric on the gate electrode; forming a first semiconductor layer on the gate dielectric having a first semiconductor material; forming a second semiconductor layer on the first semiconductor, the second semiconductor layer having a second semiconductor material different from the first semiconductor material; forming a third material layer over the second semiconductor layer; and forming at least one conductive contact through a thickness of the third material layer such that the at least one conductive contact lands on a top surface of the second semiconductor layer or a top surface of the first semiconductor layer.

Example 47 includes the subject matter of Example 46, further comprising forming a passivation layer over the third material layer.

Example 48 includes the subject matter of Example 47, wherein forming the at least one conductive contact comprises etching through an entire thickness of the passivation layer using an anisotropic etching process and etching through an entire thickness of the third material layer using an isotropic etching process.

Example 49 includes the subject matter of any one of Examples 46-48, wherein the third material layer comprises a dielectric material.

Example 50 includes the subject matter of any one of Examples 46-48, wherein the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration.

Example 51 includes the subject matter of Example 50, wherein the semiconductor material of each of the first, second, and third layers comprises indium, gallium, zinc, and oxygen.

Example 52 is an integrated circuit having a plurality of semiconductor devices, an interconnect region above the plurality of semiconductor devices and including a plurality of stacked interconnect layers, and a thin film transistor (TFT) structure across one or more interconnect layers of the plurality of stacked interconnect layers. The TFT structure includes a gate electrode, a gate dielectric on the gate electrode, a semiconductor layer on the gate dielectric, and first and second conductive contacts that each contact a respective portion of the semiconductor layer. The semiconductor layer has a material concentration gradient extending from a bottom surface of the semiconductor layer adjacent to the gate dielectric to a top surface of the semiconductor layer.

Example 53 includes the subject matter of Example 52, wherein the TFT structure further comprises a passivation layer over the semiconductor layer, such that the first and second conductive contacts extend through an entire thickness of the passivation layer.

Example 54 includes the subject matter of Example 53, wherein the passivation layer comprises aluminum and oxygen.

Example 55 includes the subject matter of any one of Examples 52-54, wherein the semiconductor layer comprises indium, gallium, zinc, and oxygen.

Example 56 includes the subject matter of Example 55, wherein the gallium has the concentration gradient within the semiconductor layer.

Example 57 includes the subject matter of Example 56, wherein the semiconductor layer has a maximum gallium concentration at the bottom surface of the semiconductor layer and a minimum gallium concentration at the top surface of the semiconductor layer.

Example 58 is a printed circuit board comprising the integrated circuit of any one of Examples 52-57.

The foregoing description of the embodiments of the disclosure has been presented for the purposes of illustration and description. It is not intended to be exhaustive or to limit the disclosure to the precise forms disclosed. Many modifications and variations will be apparent in light of this disclosure. It is intended that the scope of the disclosure be limited not by this detailed description, but rather by the claims appended hereto.

What is claimed is:

1. An integrated circuit, comprising:
a gate electrode;
a gate dielectric on the gate electrode;
a semiconductor region on the gate dielectric, wherein the semiconductor region includes one of (1) a plurality of compositionally different material layers comprising a first semiconductor layer on the gate dielectric, a second semiconductor layer over the first semiconductor layer, and a third layer over the second semiconductor layer, or (2) a single layer having a material concentration gradient extending from a bottom surface of the single layer adjacent to the gate dielectric to a top surface of the single layer; and
first and second conductive contacts that land within the first, second or third layer, or on a top surface of the first, second or third layer or that each contact a respective portion of the single layer.

2. The integrated circuit of claim 1, wherein the semiconductor region includes the single layer having the material concentration gradient and comprises an increasing gradient of indium from the bottom surface of the single layer to the top surface of the single layer, and a decreasing gradient of gallium from the bottom surface of the single layer to the top surface of the single layer.

3. The integrated circuit of claim 1, wherein the semiconductor region includes the single layer having the material concentration gradient and comprises one or both of (1) an increasing gradient of dopant from the bottom surface of the single layer to the top surface of the single layer, and (2) a decreasing gradient of a counter-dopant from the bottom surface of the single layer to the top surface of the single layer.

4. The integrated circuit of claim 1, wherein the semiconductor region includes the single layer having the material concentration gradient and comprises indium, gallium, zinc, and oxygen.

5. The integrated circuit of claim 1, wherein the first and second conductive contacts extend through a thickness of the third layer and land on a top surface of the second semiconductor layer.

6. The integrated circuit of claim 1, wherein: the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration.

7. A printed circuit board comprising the integrated circuit of claim 1.

8. The integrated circuit of claim 1, wherein the first semiconductor layer has a lower conductivity compared to the second semiconductor layer and the third layer.

9. The integrated circuit of claim 1, wherein the first and second conductive contacts each comprise a barrier layer and a metal fill, wherein the barrier layer has a semiconductor material with a same composition as the semiconductor material of at least one of the layers of the semiconductor region.

10. An integrated circuit, comprising:
a plurality of semiconductor devices;
an interconnect region above the plurality of semiconductor devices, the interconnect region comprising a plurality of stacked interconnect layers;
a thin film transistor (TFT) structure across one or more interconnect layers of the plurality of stacked interconnect layers, the TFT structure comprising
a gate electrode,
a gate dielectric on the gate electrode,
a semiconductor region on the gate dielectric, wherein the semiconductor region includes a first semiconductor layer on the gate dielectric, a second semiconductor layer over the first semiconductor layer, and a third layer over the second semiconductor layer, and
first and second conductive contacts that extend through a thickness of the third layer and land on a top surface of the second semiconductor layer.

11. A printed circuit board comprising the integrated circuit of claim 10.

12. The integrated circuit of claim 10, wherein the first semiconductor layer has a lower conductivity compared to the second semiconductor layer and the third layer.

13. The integrated circuit of claim 10, wherein the first and second conductive contacts each comprise a barrier layer and a metal fill, wherein the barrier layer has a semiconductor material with a same composition as the semiconductor material of at least one of the layers of the semiconductor region.

14. The integrated circuit of claim 10, wherein the first semiconductor layer comprises a semiconductor material having a first gallium concentration, the second semiconductor layer comprises a semiconductor material having a second gallium concentration lower than the first gallium concentration, and the third layer comprises a semiconductor material having a third gallium concentration lower than the second gallium concentration.

15. The integrated circuit of claim 14, wherein the semiconductor material of each of the first, second, and third layers comprises indium, gallium, zinc, and oxygen.

16. An integrated circuit, comprising:
a plurality of semiconductor devices;
an interconnect region above the plurality of semiconductor devices, the interconnect region comprising a plurality of stacked interconnect layers;
a thin film transistor (TFT) structure across one or more interconnect layers of the plurality of stacked interconnect layers, the TFT structure comprising
a gate electrode,
a gate dielectric on the gate electrode,
a semiconductor layer on the gate dielectric, wherein the semiconductor layer has a material concentration gradient extending from a bottom surface of the semiconductor layer adjacent to the gate dielectric to a top surface of the semiconductor layer, and
first and second conductive contacts that each contact a respective portion of the semiconductor layer.

17. A printed circuit board comprising the integrated circuit of claim 16.

18. The integrated circuit of claim 16, wherein the semiconductor layer comprises indium, gallium, zinc, and oxygen.

19. The integrated circuit of claim 18, wherein the gallium has the concentration gradient within the semiconductor layer.

20. The integrated circuit of claim 19, wherein the semiconductor layer has a maximum gallium concentration at the bottom surface of the semiconductor layer and a minimum gallium concentration at the top surface of the semiconductor layer.

* * * * *